US009330899B2

(12) United States Patent
Jung et al.

(10) Patent No.: US 9,330,899 B2
(45) Date of Patent: May 3, 2016

(54) METHOD OF DEPOSITING THIN FILM

(71) Applicant: ASM IP Holding B.V., Almere (NL)

(72) Inventors: In Soo Jung, Hwaseong-si (KR); Eun Kee Hong, Seongnam-si (KR); Seung Woo Choi, Cheonan-si (KR); Dong Seok Kang, Cheonan-si (KR); Yong Min Yoo, Seoul (KR); Pei-Chung Hsiao, Tokyo (JP)

(73) Assignee: ASM IP HOLDING B.V. (NL)

( * ) Notice: Subject to any disclaimer, the term of this patent is extended or adjusted under 35 U.S.C. 154(b) by 59 days.

(21) Appl. No.: 14/067,686

(22) Filed: Oct. 30, 2013

(65) Prior Publication Data

US 2014/0120738 A1    May 1, 2014

Related U.S. Application Data

(60) Provisional application No. 61/721,113, filed on Nov. 1, 2012.

(51) Int. Cl.
| | |
|---|---|
| *H01L 21/31* | (2006.01) |
| *H01L 21/469* | (2006.01) |
| *H01L 21/02* | (2006.01) |
| *C23C 16/40* | (2006.01) |
| *C23C 16/455* | (2006.01) |
| *H01L 21/311* | (2006.01) |

(52) U.S. Cl.
CPC ........ *H01L 21/02126* (2013.01); *C23C 16/401* (2013.01); *C23C 16/45529* (2013.01); *C23C 16/45536* (2013.01); *H01L 21/0228* (2013.01); *H01L 21/02219* (2013.01); *H01L 21/02274* (2013.01); *H01L 21/31111* (2013.01)

(58) Field of Classification Search
CPC .................. H01L 21/02126; H01L 21/02208; H01L 21/0228; H01L 21/02219; H01L 21/02274; H01L 21/31111; H01L 21/02; C23C 16/45529; C23C 16/45536; C23C 16/401

See application file for complete search history.

(56) References Cited

U.S. PATENT DOCUMENTS

| | | | |
|---|---|---|---|
| 5,766,999 | A | 6/1998 | Sato et al. |
| 6,235,568 | B1 | 5/2001 | Murthy et al. |
| 6,475,865 | B1 | 11/2002 | Yang et al. |

(Continued)

OTHER PUBLICATIONS

Perego et al., "Fabrication of GeO2 layers using a divalent Ge precursor," Applied Physics Letters 90, 2007.

*Primary Examiner* — Charles Garber
*Assistant Examiner* — Abdulfattah Mustapha
(74) *Attorney, Agent, or Firm* — Knobbe, Martens, Olson & Bear LLP

(57) ABSTRACT

A method for forming a silicon germanium oxide thin film on a substrate in a reaction space may be performed using an atomic layer deposition (ALD) process. The process may include at least one cycle comprising a germanium oxide deposition sub-cycle and a silicon oxide deposition sub-cycle. The germanium oxide deposition sub-cycle may include contacting the substrate with a germanium reactant, removing excess germanium reactant, and contacting the substrate with a first oxygen reactant. The silicon oxide deposition sub-cycle may include contacting the substrate with a silicon reactant, removing excess silicon reactant, and contacting the substrate with a second oxygen reactant. The films of the present disclosure exhibit desirable etch rates relative to thermal oxide. Depending on the films' composition, the etch rates may be higher or lower than the etch rates of thermal oxide.

26 Claims, 13 Drawing Sheets

(56) References Cited

U.S. PATENT DOCUMENTS

| | | | |
|---|---|---|---|
| 6,537,370 B1 | 3/2003 | Hernandez et al. | |
| 6,620,743 B2 | 9/2003 | Pagliaro, Jr. et al. | |
| 6,749,687 B1 | 6/2004 | Ferro et al. | |
| 6,960,537 B2 | 11/2005 | Shero et al. | |
| 7,108,748 B2 | 9/2006 | Brabant et al. | |
| 7,238,595 B2 | 7/2007 | Brabant et al. | |
| 7,312,165 B2 | 12/2007 | Jursich et al. | |
| 7,329,593 B2 | 2/2008 | Bauer et al. | |
| 2003/0036268 A1 | 2/2003 | Brabant et al. | |
| 2003/0080394 A1 | 5/2003 | Babcock et al. | |
| 2003/0111013 A1* | 6/2003 | Oosterlaken et al. | 118/724 |
| 2004/0137167 A1 | 7/2004 | Nguyen | |
| 2004/0151845 A1 | 8/2004 | Nguyen et al. | |
| 2007/0117335 A1 | 5/2007 | Sandhu et al. | |
| 2007/0155138 A1 | 7/2007 | Tomasini et al. | |
| 2008/0020593 A1* | 1/2008 | Wang et al. | 438/782 |
| 2008/0029790 A1* | 2/2008 | Ahn et al. | 257/288 |
| 2009/0074652 A1* | 3/2009 | Dussarrat | 423/508 |
| 2009/0203197 A1 | 8/2009 | Hanawa et al. | |
| 2011/0117732 A1 | 5/2011 | Bauer et al. | |
| 2012/0009802 A1 | 1/2012 | LaVoie et al. | |
| 2012/0028454 A1 | 2/2012 | Swaminathan et al. | |
| 2012/0244688 A1 | 9/2012 | Bauer et al. | |
| 2013/0126986 A1* | 5/2013 | Brodsky | H01L 21/28255 257/411 |

* cited by examiner

METHOD OF DEPOSITING THIN FILM

CROSS-REFERENCE TO RELATED APPLICATIONS

This application claims priority to U.S. Provisional application No. 61/721,113, filed Nov. 1, 2012, the disclosure of which is incorporated herein by reference in its entirety.

BACKGROUND OF THE INVENTION

1. Field of the Invention

The present application relates generally to atomic layer deposition of thin films comprising silicon and germanium.

2. Background

There has been a growing demand for thin oxide films having a variable range of wet etch rates (WER) compared to conventional thermal oxide or CVD oxide films. Additionally, such films desirably have a conformal step-coverage of greater than 95% on a device structure having an aspect ratio of 10:1 or more.

Atomic layer deposition ("ALD") is considered a promising method for depositing films having these desired features. As one example, methods for $SiO_2$ film deposition by plasma enhanced atomic layer deposition ("PEALD") at low temperatures were developed recently; however, the WER range is limited. The WER of $SiO_2$ films remains at about 20 times the WER of conventional thermal oxide. This appears to be the limit on the WER of $SiO_2$ films.

Therefore, there has been research into materials other than $SiO_2$ that could achieve a higher WER. In some research, $GeO_2$ films are considered to be a promising candidate to replace $SiO_2$ in many applications in the future. However, $GeO_2$ is relatively unstable, in part because it is easily dissolved by water and other solutions.

SUMMARY

Disclosed herein are methods for depositing SiGeO films. In some embodiments the films are deposited in a stable, repeatable, and highly controllable manner by an atomic layer deposition-type process. The methods and films are suitable, for example, for use in various semiconductor fabrication processes.

Methods for forming a silicon germanium oxide thin film on a substrate in a reaction space may be performed using a ALD processes as disclosed herein. The process may include at least one complete silicon germanium oxide deposition cycle comprising a germanium oxide deposition sub-cycle and a silicon oxide deposition sub-cycle. The germanium oxide deposition sub-cycle may include contacting the substrate with a germanium reactant, removing excess germanium reactant, and contacting the substrate with a first oxygen reactant. The silicon oxide deposition sub-cycle may include contacting the substrate with a silicon reactant, removing excess silicon reactant, and contacting the substrate with a second oxygen reactant. In some embodiments, removing comprises flowing a purge gas through the reaction space.

According to some embodiments, at least one of the first and second oxygen reactants comprises oxygen plasma. The oxygen plasma may be generated from a flowing oxygen source. In some embodiments the oxygen source may flow through the reaction chamber during one or more sub-cycles, during one or more complete silicon germanium oxide deposition cycles, or even throughout the entire process. In some embodiments oxygen plasma may be provided intermittently in the germanium oxide sub-cycle and/or the silicon oxide sub-cycle. For example, an oxygen plasma may be generated at desired intervals in the flowing oxygen source. Oxygen gas may be used as the oxygen source in some embodiments.

According to some embodiments, the number of each type of sub-cycle in one or more of the complete silicon germanium oxide deposition cycles may be varied. In some embodiments the ratio of germanium oxide deposition sub-cycles to silicon oxide deposition sub-cycles, may be varied to produce a film with desired properties, such as wet etch rates. For example, in some embodiments the ratio of germanium oxide deposition sub-cycles to silicon oxide deposition sub-cycles may be greater than or equal to about 1:1. In other embodiments the ratio may be less than or equal to about 1:1. The ratio may be selected such that the silicon germanium oxide thin film has a wet etch rate ratio of between 3 and 400 compared with thermal oxide. In some embodiments, the silicon deposition sub-cycle may precede the germanium deposition sub-cycle. The silicon germanium oxide films may achieve a step coverage of at least about 95% on a three-dimensional structure with an aspect ratio of at least about 20:1. The silicon germanium oxide films may achieve a wet etch rate ratio relative to thermal oxide of less than about 4 or greater than about 20. In some embodiments, the deposition temperature is between about 450° C. and about 50° C.

Suitable silicon reactants can include $(SiH_3)_3N$, $(SiH_3)_2$, $(SiH_3)_2NMe$, $(SiH_3)_2Net$, $(SiH_3)_2N(iPr)$, $(SiH_3)_2N(tBu)$, $SiH_3NEt_2$, $SiH_3N(iPr)_2$, $SiH_3N(tBu)_2$, $SiH_2(NEt_2)_2$, $SiH_2(NMe_2)_2$, $SiH_2(NHtBu)_2$, $SiH_2(NHSiMe_3)_2$, $Si(OEt)_4$, $SiCl_4$, $Si_2Cl_6$, $SiH_2Cl_2$, $SiH(N(Me)_2)_3$, $SiH_2[N(Et)(Me)]_2$, $Si_2(NHEt)_6$, $Si(NHEt)_4$, and $Si_3H_8$. Suitable germanium reactants can include $Ge(NMe_2)_4$, $Ge(NEtMe)_4$; $Ge(NEt_2)_4$, $iPr_3GeCl$, $iPr_3GeNMe_2$, $iPr_3GeNEtMe$, and $iPr_3GeNEt_2$. Suitable oxygen reactants can include $O_2$, $O_3$, NO, $NO_2$, $CO_2$, a plasma generated from one or more of these, or a combination thereof.

In some embodiments, the germanium reactant is $Ge[N(CH_3)_2]_4$, the silicon reactant is $SiH_2[N(C_2H_5)_2]_2$), and at least one of the first and second oxygen reactants comprises oxygen plasma.

A method for forming a silicon germanium oxide thin film on a substrate in a reaction space may be performed using an ALD process comprising multiple cycles. At least one of the cycles may include at least one ALD germanium oxide deposition sub-cycle and at least one ALD silicon oxide deposition sub-cycle. The germanium oxide deposition sub-cycle may include contacting the substrate with a germanium reactant, removing excess germanium reactant, and contacting the substrate with a first oxygen reactant. The silicon oxide deposition sub-cycle may include contacting the substrate with a silicon reactant, removing excess silicon reactant, and contacting the substrate with a second oxygen reactant. In some embodiments, at least one of the first and second oxygen reactants can be an oxygen plasma.

In some embodiments, a ratio of the at least one germanium deposition sub-cycles to the at least one silicon deposition sub-cycles may be greater than or equal to about 1:1. In some embodiments, the ratio may be less than or equal to about 1:1. The ratio, in some embodiments, may be between about 1:20 and about 20:1.

DETAILED DESCRIPTION

Figure 1:
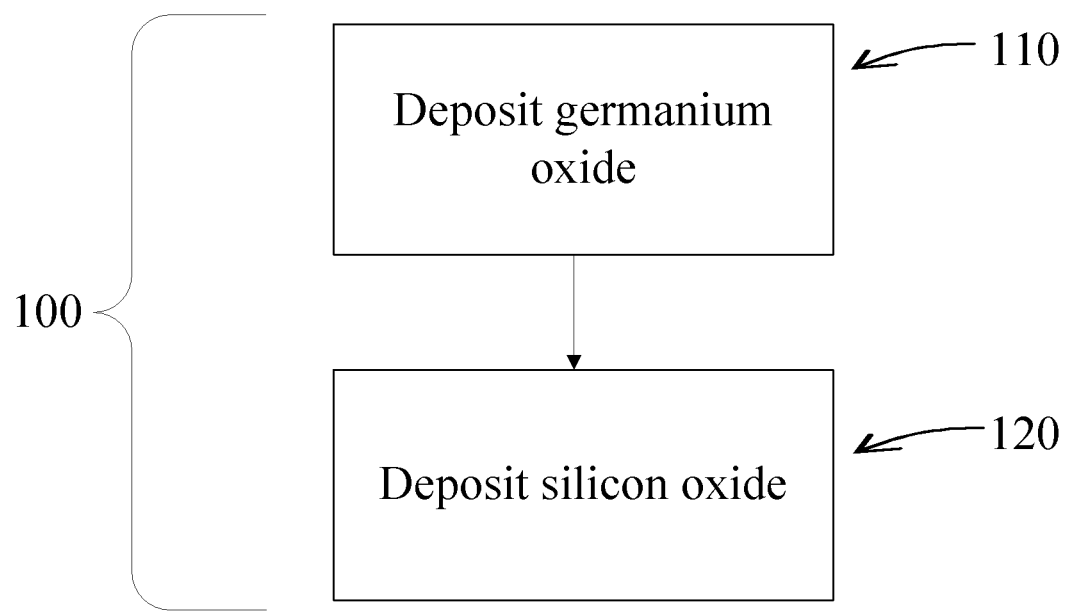
FIG. 1 is a flow chart generally illustrating a method for forming a SiGeO thin film in accordance with some embodiments.

Methods of depositing SiGeO thin films are disclosed herein. Compared to conventional $GeO_2$ processes, in some embodiments the processes disclosed herein may provide a stable, repeatable, and highly controllable film. In some embodiments not only do the films exhibit an extremely high WER that has not been previously observed, but they also achieve a robust lower WER. The presently disclosed processes can be used for various applications, as will be apparent to the skilled artisan. For example, the processes can be used in various semiconductor applications. In some embodiments the processes are used to form films used as sacrificial layers, patterning layers, mask layers, layers for use in photolithography, layers used to increase etch selectivity, tunable etch rate layers, for forming air gap layers (such as for DRAM applications), side spacers, SiO capping layers and interlayers, for example between a Ge substrate and a high-k layer. The films may also be used in planar logic and NAND Flash devices. According to some embodiments, the SiGeO films have a desirable etch rate. For example, the films may have a relatively uniform etch rate for both the vertical and the horizontal portions, when deposited onto 3-dimensional structures. Such three-dimensional structures may include, for example and without limitation, FinFETs or other types of multiple gate FETs.

In some embodiments thin film layers are deposited using a process comprising at least one cycle that deposits a germanium oxide layer and at least one cycle that deposits a silicon oxide layer. In some embodiments one or both of the cycles can be atomic layer deposition cycles, and, in some embodiments, may be plasma-enhanced atomic layer deposition (PEALD) type deposition cycles. Each of the cycles is repeated to achieve a film of a desired thickness and composition. The amounts of germanium oxide and silicon oxide, and hence the amounts of Ge and Si, may be adjusted relative to each other by varying the number of cycles used to deposit each layer. The result is a SiGeO thin film comprising a desired amount of germanium and silicon. In this way, the properties of the film, such as the etch properties, can be adjusted. As mentioned above, such SiGeO thin films have a wide variety of applications, as will be apparent to the skilled artisan.

This process of alternately depositing a layer of $GeO_2$ and $SiO_2$ can be described as a laminating process, and the film can be referred to as a $GeO_2$ and $SiO_2$ laminate. Thus, disclosed herein are various laminating processes for forming a SiGeO thin film.

ALD can provide precise control of the film composition. In some embodiments controlling the composition of a SiGeO thin film can affect the WER of that film. Additionally, ALD can provide good step coverage. Thus, in some embodiments a SiGeO thin film is deposited over a three dimensional structure, such as a fin in the formation of a finFET device. The thickness and composition of the layers can be controlled to produce a SiGeO film with the desired characteristics.

The formula of the silicon oxide is generally referred to herein as $SiO_2$ for convenience and simplicity. However, the skilled artisan will understand that the actual formula of the silicon oxide can be $SiO_x$, where x varies around 2, as long as some Si—O bonds are formed. Generally silicon oxide where Si has an oxidation state of +IV is formed and the amount of oxygen in the material might vary.

Similarly, the formula of the germanium oxide is generally referred to herein as $GeO_2$ for convenience and simplicity. However, the skilled artisan will understand that the actual formula of the germanium oxide can be $GeO_x$, where x varies around 2, as long as some Ge—O bonds are formed. Generally germanium oxide where Ge has an oxidation state of +IV is formed and the amount of oxygen in the material might vary.

Further, the formula of silicon germanium oxide is generally referred to herein as SiGeO. However, the skilled artisan will understand that the actual stoichiometry of the film will vary. The formula may also be referred to as $SiGeO_x$, where x varies around 4 as long as some Ge—O and some Si—O bonds are formed.

ALD type processes are based on controlled, self-limiting surface reactions. Gas phase reactions are avoided by contacting the substrate alternately and sequentially with reactants. Vapor phase reactants are separated from each other in the reaction chamber, for example, by removing excess reactants and/or reactant byproducts from the reaction chamber between reactant pulses. Removing excess reactants and/or reactant byproducts may be achieved, for example, by purging the reaction space after each pulse of reactant gas using either a vacuum or a purge gas. A purge gas may also be used continuously before, during, and after each pulse of reactant gas.

The methods presented herein allow deposition of SiGeO films on substrate surfaces. Geometrically challenging applications are also possible due to the nature of the ALD-type processes. According to some embodiments, atomic layer deposition (ALD) type processes are used to form SiGeO films on substrates such as integrated circuit workpieces. The substrate surface may comprise one or more three-dimensional structures. In some embodiments one or more structures may have an aspect ratio of 1:1 to 12:1 or greater.

A substrate or workpiece is placed in a reaction chamber and subjected to alternately repeated surface reactions. In particular, SiGeO thin films are formed by repetition of a two or more self-limiting ALD cycles. At least one ALD cycle is used to form $SiO_2$ and at least one ALD cycle is used to form $GeO_2$. As discussed in more detail below, the $GeO_2$ and $SiO_2$ deposition cycles may be repeated a predetermined number of times and at a selected ratio in order to deposit a SiGeO film of a desired composition and thickness. In some embodiments, an ALD cycle may result in the deposition of less than a complete layer of either $SiO_2$ or $GeO_2$.

Preferably, for forming SiGeO films each ALD cycle comprises at least two distinct phases. The provision and removal of a reactant from the reaction space may be considered a phase. For a $GeO_2$ deposition cycle, in a first phase, a first reactant comprising germanium is provided and forms no more than about one monolayer on the substrate surface. This reactant is also referred to herein as "the germanium precursor" or "germanium reactant" and may be, for example, a germanium alkoxide, such as germanium ethoxide (Ge(OEt)$_4$), or germanium alkylamino compounds, such as tetrakis (dimethylamino) germanium (TDMAGe). In a second phase, a second reactant comprising oxygen (an "oxygen reactant" or "oxygen precursor") is provided and may convert adsorbed germanium to germanium oxide. In some embodiments the second reactant comprises a reactive species. In some embodiments the reactive species comprises an excited species. In some embodiments the reactive species comprises oxygen plasma, oxygen atoms, and/or oxygen radicals. Thus, in some embodiments the cycle can be considered a PEALD cycle. In some embodiments the reactive species comprises a species of oxygen that is not excited, such as ozone, and is used, for example, in a thermal ALD process. In some embodiments the reactive species comprises an excited species made by plasma discharge. In some embodiments a reactive species may comprise a He or Ar plasma. In some embodiments a gas that is used to form a plasma may flow constantly throughout the process but only be activated intermittently. For example, oxygen gas may flow constantly throughout the ALD cycle but be subjected to RF power intermittently to form a plasma during the second phase. Additional phases may be added and phases may be removed as desired to adjust the composition of the final film.

In a $SiO_2$ deposition cycle, a third reactant comprising silicon is provided in a first phase and forms no more than about one monolayer on the substrate surface. This reactant is also referred to herein as "the silicon precursor" or "silicon reactant" and may be, for example, a silicon alkylamino compound, such as BDEAS (bis-diethylaminosilane). In a second phase, a fourth reactant comprising oxygen (an "oxygen reactant" or "oxygen precursor") is provided and may convert adsorbed silicon to silicon oxide. In some embodiments the oxygen reactant used in the $SiO_2$ deposition cycle is the same as the oxygen reactant used in the $GeO_2$ deposition cycle, while in other embodiments they may be different. In some embodiments the fourth reactant comprises a reactive species. In some embodiments the reactive species comprises an excited species. In some embodiments the reactive species comprises oxygen plasma, oxygen atoms, and/or oxygen radicals. Thus, in some embodiments the cycle can be considered a PEALD cycle. In some embodiments the reactive species comprises a species of oxygen that is not excited, such as ozone, and is used, for example, in a thermal ALD process. In some embodiments the reactive species comprises an excited species made by plasma discharge. In some embodiments a reactive species may comprise a He or Ar plasma. In some embodiments a gas that is used to form a plasma may flow constantly throughout the process but only be activated intermittently. For example, oxygen gas may flow constantly throughout the ALD cycle but be subjected to RF power intermittently to form a plasma during the second phase. Additional phases may be added and phases may be removed as desired to adjust the composition of the final film.

The terms "first," "second," "third," and "fourth" may be applied to any particular precursor or reactive species depending on the sequencing of any particular embodiment. For example, depending on the embodiment the first reactant can be either a silicon precursor, a germanium precursor, an oxygen reactant, and/or a reactive species. Similarly, depending on the embodiment the second reactant can be either a silicon precursor, a germanium precursor, an oxygen precursor, and/or a reactive species. The third reactant can be either a silicon precursor, a germanium precursor, an oxygen precursor, and/or a reactive species. And the fourth reactant can be either a silicon precursor, a germanium precursor, an oxygen precursor, and/or a reactive species. In some embodiments, the oxygen reactant is a reactive species.

The combination of at least two phases may be considered a sub-cycle. Thus, a process for depositing a SiGeO layer may comprise at least one sub-cycle and at least one sub-cycle. These may also be referred to herein as $GeO_2$ cycles and $SiO_2$ cycles. The combination of at least two sub-cycles may be considered a super-cycle or a complete SiGeO cycle. Thus, a first phase and a second phase may comprise a first sub-cycle, and a third phase and a fourth phase may comprise a second sub-cycle. These two sub-cycles may each be repeated one or more times in a complete SiGeO deposition cycle.

In some embodiments, a first sub-cycle may be repeated any number of times before initiating a second, different sub-cycle. For example, a $GeO_2$ sub-cycle may be repeated 1, 2, 3, 4, 5, 10 or more times before initiating a $SiO_2$ sub-cycle or a $SiO_2$ sub-cycle may be repeated 1, 2, 3, 4, 5, 10 or more times before initiating a $GeO_2$ sub-cycle. In some embodiments, a second sub-cycle may be repeated any number of times after completing a first sub-cycle. For example, a $GeO_2$ sub-cycle may be repeated 1, 2, 3, 4, 5, 10 or more times after one or more $SiO_2$ sub-cycles or a $SiO_2$ sub-cycle may be repeated 1, 2, 3, 4, 5, 10 or more times after one or more $GeO_2$ sub-cycles. In some embodiments, a second sub-cycle is performed prior to a first sub-cycle.

One or more of the reactants may be provided with the aid of a carrier gas, such as Ar or He. In some embodiments the silicon and germanium precursors and the reactive species are provided with the aid of a carrier gas. In some embodiments a reactive species, such as an oxygen reactant, may be generated from a reactant provided with a carrier gas, or from a carrier gas itself. In some embodiments, two of the phases may overlap, at least partially, or be combined. For example, the silicon precursor and the oxygen reactant may be provided simultaneously in pulses that partially or completely overlap and/or, the germanium precursor and the oxygen reactant may be provided simultaneously in pulses that partially or completely overlap. In addition, although referred to as the first and second sub-cycles, and the first, second, third, and fourth reactants, the order may be varied, and an ALD cycle may begin with any one of the sub-cycles and the sub-cycles may begin with any of the reactants. That is, unless specified otherwise, the reactants can be provided in any order and the process may begin with any of the reactants.

As discussed in more detail below, in some embodiments for depositing SiGeO, one or more deposition cycles begin with provision of the silicon precursor followed by an oxygen reactant, such as a reactive oxygen species, and then followed by the germanium precursor followed by an oxygen reactant, such as a reactive oxygen species. In other embodiments deposition may begin with provision of the oxygen reactant, such as a reactive oxygen species, followed by either the silicon precursor or the germanium precursor.

In some embodiments the substrate on which deposition is desired, such as a semiconductor workpiece, is loaded into a reactor. The reactor may be part of a cluster tool in which a variety of different processes in the formation of an integrated circuit are carried out. In some embodiments a flow-type reactor is utilized. In some embodiments a high-volume manufacturing-capable single wafer ALD reactor is used. In other embodiments a batch reactor comprising multiple substrates is used. For embodiments in which batch ALD reactors are used, the number of substrates is preferably in the range of 10 to 200, more preferably in the range of 50 to 150, and most preferably in the range of 100 to 130.

Exemplary single wafer reactors, designed specifically to enhance ALD processes, are commercially available from ASM America, Inc. (Phoenix, Ariz.) under the trade names Pulsar® 2000 and Pulsar® 3000 and ASM Japan K.K (Tokyo, Japan) under the trade name Eagle® XP and XP8. Exemplary batch ALD reactors, designed specifically to enhance ALD processes, are commercially available from and ASM Europe B.V (Almere, Netherlands) under the trade names A4ALD™ and A412™.

According to some embodiments, a desirable WER of a SiGeO film is achieved by controlling the relative concentrations of silicon and germanium in the film and/or by controlling any number of other process parameters during the film's formation. In some cases, it is preferable to describe the WER of any particular silicon germanium film as its wet etch rate ratio (WERR), which is a measure of the WER of the film divided by the WER of a thermal oxide under the same conditions (i.e., WERR=sample wet etch rate [nm/min]/thermal $SiO_2$ wet etch rate [nm/min]).

In some embodiments, the WERR can be decreased by increasing the number of $SiO_2$ sub-cycles relative to $GeO_2$ sub-cycles. Alternatively, the WERR of a silicon germanium film can be increased by decreasing the number of $SiO_2$ sub-cycles relative to $GeO_2$ sub-cycles. In some embodiments, increasing the number of $SiO_2$ sub-cycles is actually achieved by reducing the number of $GeO_2$ sub-cycles. Similarly, decreasing the number of $SiO_2$ sub-cycles may be achieved by increasing the number of $GeO_2$ sub-cycles.

In some embodiments, a WERR of about 3 to 4 is achieved in a SiGeO film formed using the methods disclosed herein. In some embodiments, a WERR of about 3 or less than about 3 is achieved in the SiGeO films of the present disclosure. According to some embodiments, a WERR of about 2 is possible. In some SiGeO films deposited according to the present disclosure, the WERR is up to about 120 and, in some films, up to about 400.

In some embodiments, a lower WERR can be achieved by lengthening the amount of time that a plasma is generated in the reaction space during the deposition process. Alternatively, a higher WERR can be achieved by shortening the length of time that a plasma is generated in the reaction space during the deposition process.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

The reaction chamber is typically purged between reactant pulses. In some embodiments an inert gas is used as a purge gas. The flow rate and time of each reactant is tunable, as is the purge step, allowing for control of the composition of the film.

As mentioned above, in some embodiments, a gas is provided to the reaction chamber continuously during each deposition cycle, or during the entire ALD process. In some embodiments reactive species are provided by generating a plasma in the gas, either in the reaction chamber or upstream of the reaction chamber. In some embodiments the gas is oxygen or comprises oxygen. In other embodiments the gas may be nitrogen, helium or argon or comprise nitrogen, helium or argon. An oxygen reactant may be provided in the gas and a plasma generated in the gas to generate reactive oxygen. The flowing gas may also serve as a purge gas for one or more of the first, second, third, or fourth precursors. For example, flowing oxygen may serve as a purge gas for a first silicon precursor as well as for generating reactive oxygen species for forming $SiO_2$. Flowing oxygen may also serve as a purge gas for a first germanium precursor as well as for generating reactive oxygen species for forming $GeO_2$. In some embodiments, nitrogen, argon or helium may serve as or be part of a purge gas.

In some embodiments the deposition parameters, such as the flow rate, flow time, purge time, temperature, pressure, RF power (if used) and/or the precursors themselves, may be varied in one or more deposition sub-cycles during the ALD process in order to obtain a film with the desired characteristics.

The term "pulse" may be understood to comprise feeding reactant (or purge gas or another gas) into the reaction chamber for a predetermined amount of time. The term "pulse" does not restrict the length or duration of the pulse and a pulse can be any length of time.

The deposition temperature is preferably at or below about 650° C. In some embodiments the deposition temperature is about 50° C. to about 450° C., or about 50° C. to about 400°. In some embodiments, the deposition temperature is about 200° C., 300° C., or 400° C. In some embodiments the deposition temperature may be from about 150 to about 400° C. or from about 200 to about 400° C.

As mentioned above, the substrate may be treated prior to depositing any germanium or silicon layers by ALD. For example, the substrate may be treated with a passivation chemical to prevent oxidation prior to commencing any ALD sequences. In some embodiments the substrate is treated to form an interfacial layer prior to commencing any ALD sequences.

Germanium Oxide Sub-Cycle

In some embodiments, the germanium precursor is provided first in a germanium oxide sub-cycle. After an initial surface termination, if necessary or desired, a first germanium precursor pulse is supplied to the workpiece. In accordance with some embodiments, the first precursor pulse comprises a carrier gas flow and a volatile germanium species that is reactive with the workpiece surfaces of interest. Exemplary germanium precursors include germanium alkoxides, such as germanium ethoxide ($Ge(OEt)_4$), and germanium alkylamino compounds, such as tetrakis(dimethylamino) germanium (TDMAGe). Accordingly, the germanium precursor adsorbs upon the workpiece surfaces. The first precursor pulse self-saturates the workpiece surfaces such that any excess constituents of the first precursor pulse do not further react with the molecular layer formed by this process.

The first germanium precursor pulse is preferably supplied in gaseous form. The germanium precursor gas is considered "volatile" for purposes of the present description if the species exhibits sufficient vapor pressure under the process conditions to transport the species to the workpiece in sufficient concentration to saturate exposed surfaces.

In some embodiments the germanium precursor pulse is from about 0.05 to about 5.0 seconds, about 0.1 to about 3 s or about 0.2 to about 1.0 s.

After sufficient time for a molecular layer to adsorb on the substrate surface, excess first precursor is then removed from the reaction space. In some embodiments the excess first precursor is purged by stopping the flow of the first chemistry while continuing to flow a carrier gas or purge gas for a sufficient time to diffuse or purge excess reactants and reactant by-products, if any, from the reaction space. In some embodiments the excess first precursor is purged with the aid of oxygen gas, or another purge gas, that is flowing throughout the ALD cycle.

In some embodiments, the first precursor is purged for about 0.1 to about 10 s, about 0.3 to about 5 s or about 0.3 to about 1 s. Provision and removal of the silicon precursor can be considered the first or silicon phase of the ALD cycle.

In the second phase, the adsorbed first reactant is reacted with an oxygen reactant to form germanium oxide. The oxygen reactant may be, for example, water, ozone, oxygen plasma, oxygen radicals, oxygen atoms, $H_2O_2$, $N_2O$, NO, $NO_2$, $CO_2$, nitrogen oxides $NO_x$—wherein x is from about 0.5 to about 3—or other oxygen reactants known to be used in ALD processes. In some embodiments, a reactive species, such as oxygen plasma is provided to the workpiece. An oxygen source, such as oxygen, $O_2$, may be flowed continuously to the reaction chamber during each ALD cycle in some embodiments. In other embodiments an oxygen source, such as oxygen, is provided intermittently. Oxygen plasma may be formed by generating a plasma in the oxygen source in the reaction chamber itself or upstream of the reaction chamber, for example by flowing the oxygen source through a remote plasma generator.

In some embodiments, the oxygen reactant or oxygen source flows continuously thereby overlapping the germanium reactant pulse. In some embodiments, the oxygen reactant or oxygen source is pulsed but overlaps the germanium reactant pulse at least partially. In some embodiments, one or more reactants may decompose or at least partially decompose while in the reaction space.

Typically, the oxygen reactant, such as oxygen plasma, is provided for about 0.1 to about 10 seconds. In some embodiments the oxygen reactant, such as oxygen plasma, is provided for about 0.1 to about 10 s, 0.5 to about 5 s or 0.5 to about 2.0 s. However, depending on the reactor type, substrate type and its surface area, the pulsing time may be even higher than 10 seconds. In some embodiments, pulsing times can be on the order of minutes. The optimum pulsing time can be readily determined by the skilled artisan based on the particular circumstances.

Oxygen plasma may be generated by applying RF power of from about 10 W to about 1500 W, preferably from about 30 W to about 1000 W, more preferably from about 50 W to about 500 W in some embodiments. The RF power may be applied to oxygen or other oxygen source that flows only during the oxygen plasma pulse time, that flows continuously through the reaction chamber during the sub-cycle or even during the entire SiGeO deposition process, and/or that flows through a remote plasma generator. Thus in some embodiments the plasma is generated in situ, while in other embodiments the plasma is generated remotely and transported to the reaction space.

After a time period sufficient to completely react the previously adsorbed molecular layer with the oxygen reactant, for example the oxygen plasma pulse, any excess reactant and reaction byproducts are removed from the reaction space. As with the removal of the first reactant, this step may comprise stopping the generation of reactive species or provision of reactant and continuing to flow a carrier gas, or in some embodiments the oxygen source gas, for a time period sufficient for excess reactant, such as reactive oxygen species, and volatile reaction by-products to diffuse out of and be purged from the reaction space. In some embodiments a separate purge gas may be used. The purge may, in some embodiments, be from about 0.1 to about 10 s, about 0.1 to about 4 s or about 0.1 to about 0.5 s. Together, the oxygen reactant provision and removal represent a second phase in a germanium oxide atomic layer deposition cycle, and can also be considered an oxidation phase or the germanium oxidation phase.

The two phases together represent one germanium oxide ALD cycle, which is repeated to form one or more germanium oxide layers. As mentioned above, while referred to as forming a germanium oxide layer, in some embodiments less than a complete molecular layer may be formed in each cycle, for example due to steric interactions that prevent adsorption to all available binding sites. In other embodiments reaction conditions may be such that more than a complete monolayer is formed in each deposition cycle.

While the ALD cycle is generally referred to herein as beginning with the germanium phase, it is contemplated that in other embodiments the cycle may begin with the oxidation phase. One of skill in the art will recognize that the first precursor phase generally reacts with the termination left by the last phase in the previous cycle. Thus, while no reactant may be previously adsorbed on the substrate surface or present in the reaction space if the oxidation phase is the first phase in the first ALD cycle, in subsequent cycles the oxidation phase will effectively follow the germanium phase.

The germanium oxide ALD processes described herein can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

According to some embodiments, a germanium oxide thin film is formed by an ALD-type process comprising multiple pulsing cycles, each cycle comprising:
  pulsing a vaporized first Ge precursor into the reaction chamber to form at most a molecular monolayer of the Ge precursor on the substrate,
  purging the reaction chamber to remove excess Ge precursor and reaction by products, if any,
  providing a pulse of a second reactant onto the substrate,
  purging the reaction chamber to remove excess second reactant and any gaseous by-products formed in the reaction between the Ge precursor layer on the first surface of the substrate and the second reactant, and
  repeating the pulsing and purging steps until a germanium oxide thin film of the desired thickness has been formed.

According to some embodiments, a germanium oxide thin film is formed by an ALD-type process comprising multiple pulsing cycles, each cycle comprising:

- continuously flowing an oxygen source gas through a reaction chamber comprising a substrate,
- pulsing a vaporized first Ge precursor into the reaction chamber to form at most a molecular monolayer of the Ge precursor on the substrate,
- purging the reaction chamber to remove excess Ge precursor and reaction by products, if any,
- energizing the flowing oxygen source gas with an energy source, such as RF power, for a time period to generate reactive oxygen species that react with the germanium on the substrate to form germanium oxide,
- purging the reaction chamber to remove excess reactant and any gaseous by-products formed in the reaction between the Ge precursor layer on the first surface of the substrate and the reactive oxygen species, and
- repeating the pulsing and purging steps until a germanium oxide thin film of the desired thickness has been formed.

In some embodiments utilizing the sequence described above with a continuously flowing oxygen source, the oxygen source may also serve as a purge gas. In some embodiments, an additional gas is used as a purge gas. In some embodiments the oxygen source gas does not flow continuously but is pulsed into the reaction chamber and energized after purging the germanium precursor.

In some embodiments germanium oxide, preferably $GeO_2$, is deposited from alternating and sequential pulses of a Ge precursor and an oxygen reactant, like water, ozone, oxygen plasma, oxygen radicals, or oxygen atoms. In some embodiments the oxygen reactant is not water. In some embodiments the Ge precursor preferably comprises $Ge(OEt)_4$ or TDMAGe.

The Ge precursor employed in the ALD type processes may be solid, liquid, or gaseous material under standard conditions (room temperature and atmospheric pressure), provided that the Ge precursor is in vapor phase before it is conducted into the reaction chamber and contacted with the substrate surface.

As an example, for a 300 mm wafer in a single wafer ALD reactor, a Ge precursor may be pulsed for from about 0.05 seconds to about 10 seconds, more preferably for from about 0.1 seconds to about 5 seconds and most preferably for from about 0.3 seconds to about 3.0 seconds. The oxygen-containing precursor, such as oxygen plasma, is preferably pulsed for from about 0.05 seconds to about 10 seconds, more preferably for from about 0.1 seconds to about 5 seconds, most preferably for from about 0.2 seconds to about 3.0 seconds. However, pulsing times can be on the order of minutes in some cases. The optimum pulsing time can be readily determined by the skilled artisan based on the particular circumstances.

As mentioned above, in some embodiments the Ge precursor is $Ge(OEt)_4$ or TDMAGe. Other possible germanium precursors that can be used in some embodiments are described below. In some embodiments the Ge precursor is $Ge(OMe)_4$. In some embodiments the Ge-precursor is not a halide. In some embodiments the Ge-precursor may comprise a halogen in at least one ligand, but not in all ligands. In some embodiments the Ge precursor comprises at least one amine or alkylamine ligand, such as those presented in formulas (2) through (6) and (8) and (9), below.

The oxygen source may be an oxygen-containing gas pulse and can be a mixture of oxygen and inactive gas, such as nitrogen or argon. In some embodiments the oxygen reactant may be a molecular oxygen-containing gas pulse. The preferred oxygen content of the oxygen-source gas is from about 10% to about 25%. Thus, one source of oxygen may be air. In some embodiments, the oxygen reactant is molecular oxygen. In some embodiments, the oxygen reactant comprises an activated or excited oxygen species. In some embodiments, the oxygen reactant comprises ozone. The oxygen reactant may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the oxygen reactant is oxygen plasma.

In some embodiments, ozone or a mixture of ozone and another gas is pulsed into the reaction chamber. In other embodiments, ozone is formed inside the reactor, for example by conducting oxygen containing gas through an arc.

In other embodiments, an oxygen containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of a remote plasma, the pathway to the substrate can be optimized to maximize electrically neutral species and minimize ion survival before reaching the substrate.

As mentioned above, in some embodiments, an oxygen source continuously flows through the reactor, and a plasma is generated intermittently by energizing the oxygen source with RF energy or some other plasma generator. In some embodiments, an oxygen source is pulsed through the reaction space only intermittently and energized simultaneously by a plasma generator, which may be within the reaction space or upstream. Moreover, in some embodiments, an oxygen source is pulsed intermittently and activated by a plasma generator but also continues to flow for a period of time after the generator is turned off in order to purge the reaction space of any excess plasma or reaction byproducts.

In some embodiments, the germanium precursor and the oxygen reactant are provided prior to any purge step. Thus, in some embodiments a pulse of germanium precursor is provided, a pulse of oxygen reactant is provided, and any unreacted germanium and oxygen precursor is purged from the reaction space. The germanium precursor and the oxygen reactant may be provided sequentially, beginning with either the germanium or the oxygen reactant, or together. In some embodiments, the germanium precursor and oxygen reactant are provided simultaneously. The ratio of the oxygen precursor to the germanium precursor may be selected to obtain a desired composition of germanium oxide in the deposited thin film.

In some embodiments the oxygen reactant is an oxygen reactant other than water. Thus, in some embodiments water is not provided in any ALD cycle for depositing $GeO_2$.

Before starting the deposition of the film, the substrate is typically heated to a suitable deposition temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on.

Silicon Oxide Sub-Cycle

In some embodiments, a silicon precursor is provided first in a silicon oxide sub-cycle. After an initial surface termination, if necessary or desired, a silicon precursor pulse is supplied to the workpiece. In accordance with some embodiments, the silicon precursor pulse comprises a carrier gas flow and a volatile silicon species, such as a silicon alkylamino compound like BDEAS, that is reactive with the workpiece surfaces of interest and/or any previously deposited layers. Accordingly, the silicon precursor adsorbs upon the workpiece surfaces and/or any previously deposited layers. The silicon precursor pulse self-saturates the workpiece surfaces such that any excess constituents of the first precursor pulse do not further react with the molecular layer formed by this process.

The silicon precursor pulse is preferably supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon precursor pulse is from about 0.05 to about 5.0 seconds, about 0.1 to about 3 s or about 0.2 to about 1.0 s.

After sufficient time for a molecular layer to adsorb on the substrate surface, excess silicon precursor is then removed from the reaction space. In some embodiments the excess silicon precursor is purged by stopping the flow of the silicon chemistry while continuing to flow a carrier gas or purge gas for a sufficient time to diffuse or purge excess reactants and reactant by-products, if any, from the reaction space. In some embodiments the excess silicon precursor is purged with the aid of oxygen gas, or another purge gas, that is flowing throughout the ALD cycle.

In some embodiments, the third or silicon precursor is purged for about 0.1 to about 10 s, about 0.3 to about 5 s or about 0.3 to about 1 s. Provision and removal of the silicon precursor can be considered the third or silicon phase of the ALD cycle.

In the second phase of the silicon oxide sub-cycle, the adsorbed silicon reactant is reacted with an oxygen reactant to form silicon oxide. The oxygen reactant may be, for example, water, ozone, oxygen plasma, oxygen radicals, oxygen atoms, $H_2O_2$, $N_2O$, $NO$, $NO_2$, $CO_2$, nitrogen oxides $NO_x$—wherein x is from about 0.5 to about 3—or other oxygen reactants known to be used in ALD processes. In some embodiments a reactive species, such as oxygen plasma is provided to the workpiece. An oxygen source, such as oxygen, $O_2$, is flowed continuously to the reaction chamber during each silicon oxide sub-cycle in some embodiments, or even throughout the entire SiGeO deposition process. In other embodiments the oxygen source is provided intermittently. Oxygen plasma may be formed by generating a plasma in the oxygen source in the reaction chamber or upstream of the reaction chamber, for example by flowing the oxygen source through a remote plasma generator.

In some embodiments, the oxygen reactant or oxygen source flows continuously thereby overlapping the silicon reactant pulse. In some embodiments, the oxygen reactant or oxygen source is pulsed but overlaps the silicon reactant pulse at least partially.

Typically, the oxygen reactant, such as oxygen plasma, is provided for about 0.1 to about 10 seconds. In some embodiments the oxygen reactant such as oxygen plasma, is provided for about 0.1 to about 10 s, 0.5 to about 5 s or 0.5 to about 2.0 s. However, depending on the reactor type, substrate type and its surface area, the pulsing time may be even higher than 10 seconds. In some embodiments, pulsing times can be on the order of minutes. The optimum pulsing time can be readily determined by the skilled artisan based on the particular circumstances.

Oxygen plasma may be generated from an oxygen source by applying RF power of from about 10 W to about 1000 W, preferably from about 30 W to about 500 W, more preferably from about 50 W to about 300 W in some embodiments. The RF power may be applied to oxygen or another oxygen source that flows during the oxygen plasma pulse time, that flows continuously through the reaction chamber, and/or that flows through a remote plasma generator. Thus in some embodiments the plasma is generated in situ, while in other embodiments the plasma is generated remotely.

After a time period sufficient to completely saturate and react the previously adsorbed molecular layer with the oxygen reactants, such as an oxygen plasma pulse, any excess reactant and reaction byproducts are removed from the reaction space. As with the removal of the silicon reactant, this step may comprise stopping the generation of reactive species or provision of reactant and continuing to flow of a carrier gas, in some embodiments the oxygen source gas, for a time period sufficient for excess reactant, such as reactive oxygen species, and volatile reaction by-products to diffuse out of and be purged from the reaction space. In some embodiments a separate purge gas may be used. The purge may, in some embodiments, be from about 0.1 to about 10 s, about 0.1 to about 4 s or about 0.1 to about 0.5 s. Together, the oxygen reactant (for example oxygen plasma) provision and removal represent a second phase in a $SiO_2$ atomic layer deposition sub-cycle.

As mentioned above, while referred to as forming a silicon oxide layer, in some embodiments less than a complete molecular layer may be formed in some cycles, for example due to steric interactions that prevent adsorption to all available binding sites. In other embodiments reaction conditions may be such that more than a complete monolayer is formed in each deposition cycle.

The $SiO_2$ sub-cycle is repeated to form silicon oxide layers. While the sub-cycle is generally referred to herein as beginning with the silicon phase, it is contemplated that in other embodiments the cycle may begin with the oxidation phase. One of skill in the art will recognize that the first precursor phase of the ALD process generally reacts with the termination left by the last phase in the previous cycle. Thus, while no silicon reactant may be previously adsorbed on the substrate surface or present in the reaction space if the oxidation phase is the first phase in the first silicon oxide sub-cycle, in subsequent sub-cycles the oxidation phase will effectively follow the silicon phase.

According to some embodiments, a silicon oxide thin film is formed by an ALD-type process comprising multiple pulsing cycles, each cycle comprising:
  pulsing a vaporized first Si precursor into the reaction chamber to form at most a molecular monolayer of the Si precursor on the substrate,
  purging the reaction chamber to remove excess Si precursor and reaction by products, if any,
  providing a pulse of a second oxygen reactant onto the substrate,
  purging the reaction chamber to remove excess second reactant and any gaseous by-products formed in the reaction between the Si precursor layer on the first surface of the substrate and the second reactant, and
  repeating the pulsing and purging steps until a silicon oxide thin film of a desired thickness has been formed.

According to some embodiments, a silicon oxide thin film is formed by an ALD-type process comprising multiple pulsing cycles, each cycle comprising:
- continuously flowing an oxygen source gas through a reaction chamber comprising a substrate,
- pulsing a vaporized first Si precursor into the reaction chamber to form at most a molecular monolayer of the Si precursor on the substrate,
- purging the reaction chamber to remove excess Si precursor and reaction by products, if any,
- energizing the flowing oxygen with an energy source, such as RF power, for a time period to generate reactive oxygen species that react with the deposited silicon to form silicon oxide,
- purging the reaction chamber to remove excess reactant and any gaseous by-products formed in the reaction between the Si precursor layer on the first surface of the substrate and the reactive oxygen species, and
- repeating the pulsing and purging steps until a silicon oxide thin film of a desired thickness has been formed.

In some embodiments utilizing the sequence described above with a continuously flowing oxygen source, the oxygen source may also serve as a purge gas. In some embodiments, an additional gas is used as a purge gas. In some embodiments the oxygen source does not flow continuously but is pulsed into the reaction chamber and energized after purging the silicon precursor.

As mentioned above, each pulse or phase of each ALD cycle is preferably self-limiting. An excess of reactants is supplied in each phase to saturate the susceptible structure surfaces. Surface saturation ensures reactant occupation of all available reactive sites (subject, for example, to physical size or "steric hindrance" restraints) and thus ensures excellent step coverage. In some embodiments the pulse time of one or more of the reactants can be reduced such that complete saturation is not achieved and less than a monolayer is adsorbed on the substrate surface.

The Si precursor employed in the ALD type processes may be solid, liquid, or gaseous material under standard conditions (room temperature and atmospheric pressure), provided that the Si precursor is in vapor phase before it is conducted into the reaction chamber and contacted with the substrate surface. Some exemplary silicon precursors are provided below.

As an example, for a 300 mm wafer in a single wafer ALD reactor, a Si precursor may be pulsed for from about 0.05 seconds to about 10 seconds, more preferably for from about 0.1 seconds to about 5 seconds and most preferably for from about 0.3 seconds to about 3.0 seconds. The oxygen-containing precursor, such as oxygen plasma, is preferably pulsed for from about 0.05 seconds to about 10 seconds, more preferably for from about 0.1 seconds to about 5 seconds, most preferably for from about 0.2 seconds to about 3.0 seconds. However, pulsing times can be on the order of minutes in some cases. The optimum pulsing time can be readily determined by the skilled artisan based on the particular circumstances.

The oxygen source may be an oxygen-containing gas pulse and can be a mixture of oxygen and inactive gas, such as nitrogen or argon. In some embodiments the oxygen reactant may be a molecular oxygen-containing gas pulse. The preferred oxygen content of the oxygen-source gas is from about 10% to about 25%. Thus, one source of oxygen may be air. In some embodiments, the oxygen reactant is molecular oxygen. In some embodiments, the oxygen reactant comprises an activated or excited oxygen species. In some embodiments, the oxygen reactant comprises ozone. The oxygen reactant may be pure ozone or a mixture of ozone, molecular oxygen, and another gas, for example an inactive gas such as nitrogen or argon. Ozone can be produced by an ozone generator and it is most preferably introduced into the reaction space with the aid of an inert gas of some kind, such as nitrogen, or with the aid of oxygen. In some embodiments, ozone is provided at a concentration from about 5 vol-% to about 40 vol-%, and preferably from about 15 vol-% to about 25 vol-%. In other embodiments, the oxygen reactant is oxygen plasma.

In some embodiments, ozone or a mixture of ozone and another gas is pulsed into the reaction chamber. In other embodiments, ozone is formed inside the reactor, for example by conducting oxygen containing gas through an arc.

In other embodiments, an oxygen containing plasma is formed in the reactor. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of a remote plasma, the pathway to the substrate can be optimized to maximize electrically neutral species and minimize ion survival before reaching the substrate.

As discussed above, in some embodiments, an ALD process begins with one or more germanium oxide sub-cycles comprising the germanium phase, followed by the oxidation phase and, in turn, one or more silicon oxide sub-cycles comprising the silicon and silicon oxidation phases. However, in other embodiments the one or more silicon oxide sub-cycles comprising the silicon and silicon oxidation phases are first, followed by the one or more germanium oxide sub-cycles comprising germanium and germanium oxidation phases. The oxygen plasma may be generated in situ, for example in an oxygen gas that flows continuously throughout the ALD cycle or that is provided intermittently and activated, or the oxygen plasma may be generated remotely and transported to the reaction space.

In some embodiments, the silicon precursor and the oxygen reactant are provided prior to any purge step. Thus, in some embodiments a pulse of silicon precursor is provided, a pulse of oxygen precursor is provided, and any unreacted silicon and oxygen precursor is purged from the reaction space. The silicon precursor and the oxygen precursor may be provided sequentially, beginning with either the silicon or the oxygen reactant, or together. In some embodiments, the silicon precursor and oxygen precursor are provided simultaneously. The ratio of the oxygen precursor to the silicon precursor may be selected to obtain a desired composition of silicon oxide in the deposited thin film.

Mixed Metal Oxide Deposition by ALD

The SiGeO thin films disclosed herein can be described as mixed metal films where silicon and germanium are referred to as either the first and second metals or the second and first metals. For more information on forming mixed metal films, the benefits of such films, and desirable process parameters, please refer to U.S. Publication No. 2012/0302055, the entire disclosure of which is incorporated by reference.

As discussed above, in some embodiments the silicon germanium oxide is deposited by an atomic layer deposition (ALD) type process comprising multiple complete silicon germanium oxide ALD cycles (also referred to as supercycles). Each complete silicon germanium oxide ALD cycle comprises a first deposition sub-cycle for forming up to a monolayer of silicon oxide and a second deposition sub-cycle for forming up to a monolayer of germanium oxide. The number of first deposition sub-cycles and second deposition sub-cycles in each complete silicon germanium oxide ALD cycle are varied to achieve the desired composition of the SiGeO film. Further, the number of complete silicon germanium oxide ALD cycles is varied to deposit a SiGeO film with the desired thickness.

The germanium content can be expressed as a ratio or percentage of the overall metal content in the film, e.g. germanium/(silicon+germanium). For example, in a mixed metal oxide film comprising Ge and Si, the Ge content can be expressed as Ge/(Ge+Si). In some embodiments the germanium is about 0-10%, 0-20% or about 0-50% of the total metal in the mixed metal oxide.

In some embodiments the first and second deposition sub-cycles are performed at the same reaction temperature. In some embodiments, the first and second deposition sub-cycles are performed in the same reactor.

The first and second deposition sub-cycles are provided at a selected ratio to deposit a silicon germanium oxide film with a desired ratio of the germanium to silicon. For example, in some embodiments the ratio of the silicon oxide deposition sub-cycle to the germanium oxide deposition sub-cycle in the complete silicon germanium oxide ALD process may be about 1:20, about 1:10, about 1:6, about 1:5, about 1:4, about 1:2, or about 1:1. In some embodiments the ratio of the germanium oxide deposition sub-cycle to the silicon oxide deposition sub-cycle in each complete silicon germanium oxide ALD cycle may be about 1:20, about 1:10, about 1:6, about 1:5, about 1:4, about 1:2, or about 1:1. In some embodiments the ratio of silicon oxide deposition sub-cycles to germanium oxide deposition sub-cycles is the same in all of the complete silicon germanium oxide ALD cycles performed in the ALD process. In other embodiments the specific ratio of silicon oxide deposition sub-cycles to germanium oxide deposition sub-cycles can be varied in different complete ALD cycles. In some embodiments, at least one complete cycle may comprise the deposition of only $SiO_2$ or only $GeO_2$. Thus, it is possible to achieve pure $SiO_2$ or pure $GeO_2$ in at least part of the film. The specific ratios can be selected by the skilled artisan to provide the desired amounts of germanium and silicon in the silicon germanium oxide.

In some embodiments one or both of the germanium oxide sub-cycle and the silicon oxide sub-cycle can be repeated two or more times in each SiGeO cycle. For example, the silicon oxide sub-cycle can be repeated from one to ten times and the germanium oxide sub-cycle can be repeated from one to ten times in a SiGeO cycle. The number of silicon oxide sub-cycles can be referred to as a and the number of germanium oxide sub-cycles can be referred to as b. In some embodiments a is from 1 to 20 or more and b is from 1 to 20 or more in each SiGeO cycle. In some embodiments a is from 1 to 10 and b is from 1 to 10 in each SiGeO cycle. For example, the ratio of silicon oxide cycles to germanium oxide cycles in a SiGeO cycle may be 3:5. As another example, the ratio of silicon oxide cycles to germanium oxide cycles in a SiGeO cycle may be 5:3.

It follows that in some embodiments the ALD process will comprise more of the silicon oxide deposition sub-cycles than the germanium oxide deposition sub-cycles. Thus, the silicon germanium oxide that is formed will comprise more silicon than germanium. In some embodiments at least 80%, at least 85%, at least 90%, at least 95%, at least 97%, at least 98%, at least 99% or at least 99.5% of the total silicon and germanium in the silicon germanium oxide is silicon. In some embodiments about 30-80%, or about 40-60% of the total silicon and germanium in the silicon germanium oxide is germanium.

It also follows that in some embodiments the ALD process will comprise more of the germanium oxide deposition sub-cycles than the silicon oxide deposition sub-cycles. Thus, the silicon germanium oxide that is formed will comprise more germanium than silicon. In some embodiments at least 80%, at least 85%, at least 90%, at least 95%, at least 97%, at least 98%, at least 99% or at least 99.5% of the total silicon and germanium is germanium. In some embodiments about 30-80%, or about 40-60% of the total silicon and germanium is silicon.

FIG. 1 is a flow chart generally illustrating a complete SiGeO ALD deposition cycle that can be used to deposit a SiGeO thin film in accordance with some embodiments. In some embodiments, less than a complete monolayer of film is deposited in one or more cycles or sub-cycles. According to one embodiment, a SiGeO thin film is formed on a substrate by an ALD type process comprising a deposition cycle 100 having at least one germanium oxide deposition sub-cycle 110, or first deposition sub-cycle 110, and at least one silicon oxide deposition sub-cycle 120, or second deposition sub-cycle 120.

At least one germanium oxide deposition sub-cycle 110 comprises:
  contacting a substrate with a vaporized germanium compound such that the germanium compound adsorbs on the substrate surface;
  purging the reaction space of excess germanium reactant and reaction byproducts; and
  providing an oxygen reactant, such as a reactive oxygen species, to the reaction chamber, thereby converting the adsorbed germanium compound into germanium oxide.

In some embodiments, the germanium oxide deposition sub-cycle 110 is repeated 1, 2, 3, 4, 5, 10, 20, 50, 100 or more times in succession.

Each silicon oxide deposition sub-cycle 120 comprises:
  contacting a substrate with a vaporized silicon compound such that the silicon compound adsorbs on the substrate surface;
  purging the reaction space of excess silicon reactant and reaction byproducts; and
  providing an oxygen reactant, such as a reactive oxygen species, to the reaction chamber, thereby converting the adsorbed silicon compound and oxygen compound into silicon oxide.

In some embodiments, the silicon oxide deposition sub-cycle 120 is repeated 1, 2, 3, 4, 5, 10, 20, 50, 100 or more times in succession.

The first and second deposition sub-cycles 110 and 120 are repeated a predetermined number of times in a complete ALD cycle 100, and the complete ALD cycle 100 is repeated to form a mixed metal oxide, or SiGeO, of a desired thickness comprising a desired concentration of germanium and silicon.

In some embodiments, the number of times the first deposition sub-cycle 110 and second deposition sub-cycle 120 are repeated is the same in each cycle 100. In other embodiments, the number of first and second deposition sub-cycles 110, 120 varies in one or more complete ALD cycles 100. The number of first and second sub-cycles 110, 120 in each complete ALD cycle 100 and the total number of first and second sub-cycles 110, 120 and total ALD cycles 100 can be adjusted to achieve deposition of a SiGeO thin film of a desired thickness and composition.

In some embodiments the first and second oxygen reactants are the same, while in other embodiments the first and second oxygen reactants are different. In some embodiments, the oxygen reactant comprises oxygen plasma or another reactive oxygen species.

Although illustrated as beginning with the first deposition sub-cycle 110, each complete ALD cycle 100 may begin and end with either the first or second deposition sub-cycle. For example, the growth of the silicon germanium oxide can be started with the deposition of a silicon oxide using the silicon oxide deposition sub-cycle and growth can be ended with the deposition of germanium oxide using the germanium oxide deposition sub-cycle. In some embodiments, alternating layers of germanium and silicon oxides can be deposited.

Each of the first and second deposition sub-cycles typically comprises alternating pulses of silicon or germanium precursor and an oxygen reactant. The oxygen reactant pulse may be, for example, an oxygen containing plasma. The oxygen plasma is formed in the reactor in some embodiments. In some embodiments, the plasma may be formed in situ on top of the substrate or in close proximity to the substrate. In other embodiments, the plasma is formed upstream of the reaction chamber in a remote plasma generator and plasma products are directed to the reaction chamber to contact the substrate. As will be appreciated by the skilled artisan, in the case of a remote plasma the pathway to the substrate can be optimized to maximize electrically neutral species and minimize ion survival before reaching the substrate.

Although some embodiments are disclosed as utilizing a plasma, it will be recognized by one of skill in the art that non-plasma processes are also contemplated and could be easily incorporated into the presently disclosed methods. For example, in some embodiments, sub-cycle 110 comprises the pulse of a germanium source and an oxygen reactant into a reaction space sequentially, simultaneously, or overlappingly. The sub-cycle may be conducted without the use of plasma. Similarly, sub-cycle 120 comprises, in some embodiments, the pulse of a silicon source and an oxygen source into a reaction space sequentially, simultaneously, or overlappingly. The sub-cycle may be conducted without the use of plasma.

Moreover, in some embodiments, a silicon oxide layer, a germanium oxide layer, or a SiGeO film may be subjected to a plasma treatment. That is, a plasma treatment may be provided after one or more silicon oxide sub-cycles, after one or more germanium oxide sub-cycles or after one or more complete SiGeO cycles. In some embodiments a plasma treatment is applied to a deposited SiGeO film.

As mentioned above, before starting the deposition of the film, the substrate is typically heated to a suitable growth temperature. Preferably, the growth temperature of is less than about 500° C., more preferably less than about 450° C. In some embodiments, the temperature is from about 50° C. to about 450° C. In some embodiments, the temperature is about 50° C., about 200° C., about 300° C., or about 400° C. The preferred deposition temperature may vary depending on a number of factors such as, and without limitation, the reactant precursors, the pressure, flow rate, the arrangement of the reactor, and the composition of the substrate including the nature of the material to be deposited on. The specific growth temperature may be selected by the skilled artisan based on the particular circumstances.

The processing time depends, in part, on the thickness of the layer to be produced, the composition of the film, and the growth rate of the individual deposition sub-cycles.

Figure 2:
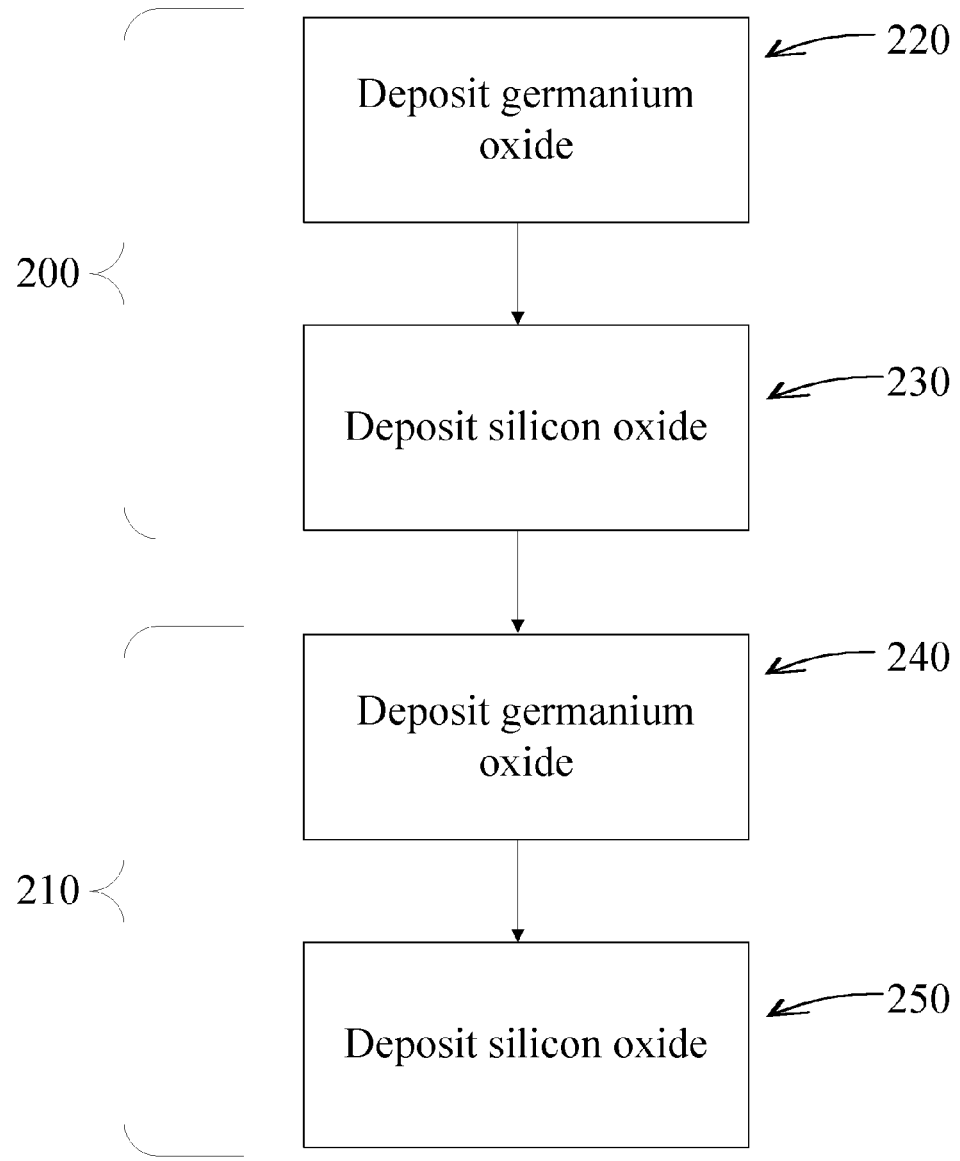
FIG. 2 is a flow chart generally illustrating a method for forming a SiGeO thin film in accordance with some embodiments.

FIG. 2 is a flow chart generally illustrating a SiGeO ALD deposition cycle that can be used to deposit a SiGeO thin film in accordance with some embodiments. According to one embodiment, a SiGeO thin film is formed on a substrate by an ALD type process comprising at least one complete SiGeO deposition cycle 200 and at least one complete SiGeO deposition cycle 210. Deposition cycle 200 may be performed a single time or may be repeated any number of times, and deposition cycle 210 may also be performed only a single time or repeated any number of times. The number of times that deposition cycles 200 and 210 are performed may be the same or different. In addition, deposition cycles 220, 230, 240 and 250 may be repeated one, two or more times in each cycle 200 and 210.

Deposition cycle 200 comprises one or more germanium oxide deposition sub-cycles 220 and one or more silicon oxide deposition sub-cycles 230. The sub-cycles 220 and 230 may be repeated at a desired ratio in order to obtain a film with desired properties. Germanium oxide deposition sub-cycle 220 comprises:
  contacting a substrate with a vaporized germanium compound such that the germanium compound adsorbs on the substrate surface;
  providing an oxygen reactant to the reaction space, thereby converting the adsorbed germanium compound into germanium oxide.

In some embodiments, the oxygen reactant comprises oxygen plasma. In some embodiments, no plasma is generated. In some embodiments, an oxygen source may flow continuously throughout the cycle, with oxygen plasma formed at the appropriate times to convert adsorbed germanium compound into germanium oxide.

Silicon oxide deposition sub-cycle 230 comprises:
  contacting a substrate with a vaporized silicon compound such that the silicon compound adsorbs on the substrate surface;
  providing an oxygen reactant to the reaction space, thereby converting the adsorbed silicon compound into silicon oxide.

In some embodiments, the oxygen reactant comprises oxygen plasma. In some embodiments, no plasma is generated. In some embodiments, an oxygen source may flow continuously throughout the cycle, with oxygen plasma formed at the appropriate times to convert adsorbed silicon compound and oxygen precursor into silicon oxide.

And just as the number of times that deposition cycle 200 may be varied independently of the number of times that deposition cycle 210 is varied, the germanium oxide deposition sub-cycle 220 may be performed any number of times before performing the silicon oxide deposition sub-cycle 230, and the number of times that the silicon oxide deposition sub-cycle 230 is performed may be varied independently of the number of times that the germanium oxide deposition sub-cycle 220 is performed.

Similar to deposition cycle 200, deposition cycle 210 comprises a germanium oxide deposition sub-cycle 240 and a silicon oxide deposition sub-cycle 250. As with germanium oxide deposition sub-cycle 220, the sub-cycles 240 and 250 may be carried out at a desired ratio. That is, sub-cycle 240 may be repeated any number of times before performing silicon oxide deposition sub-cycle 250. And sub-cycle 250 may be varied independently of the number of times that sub-cycle 240 is performed.

Figure 3:
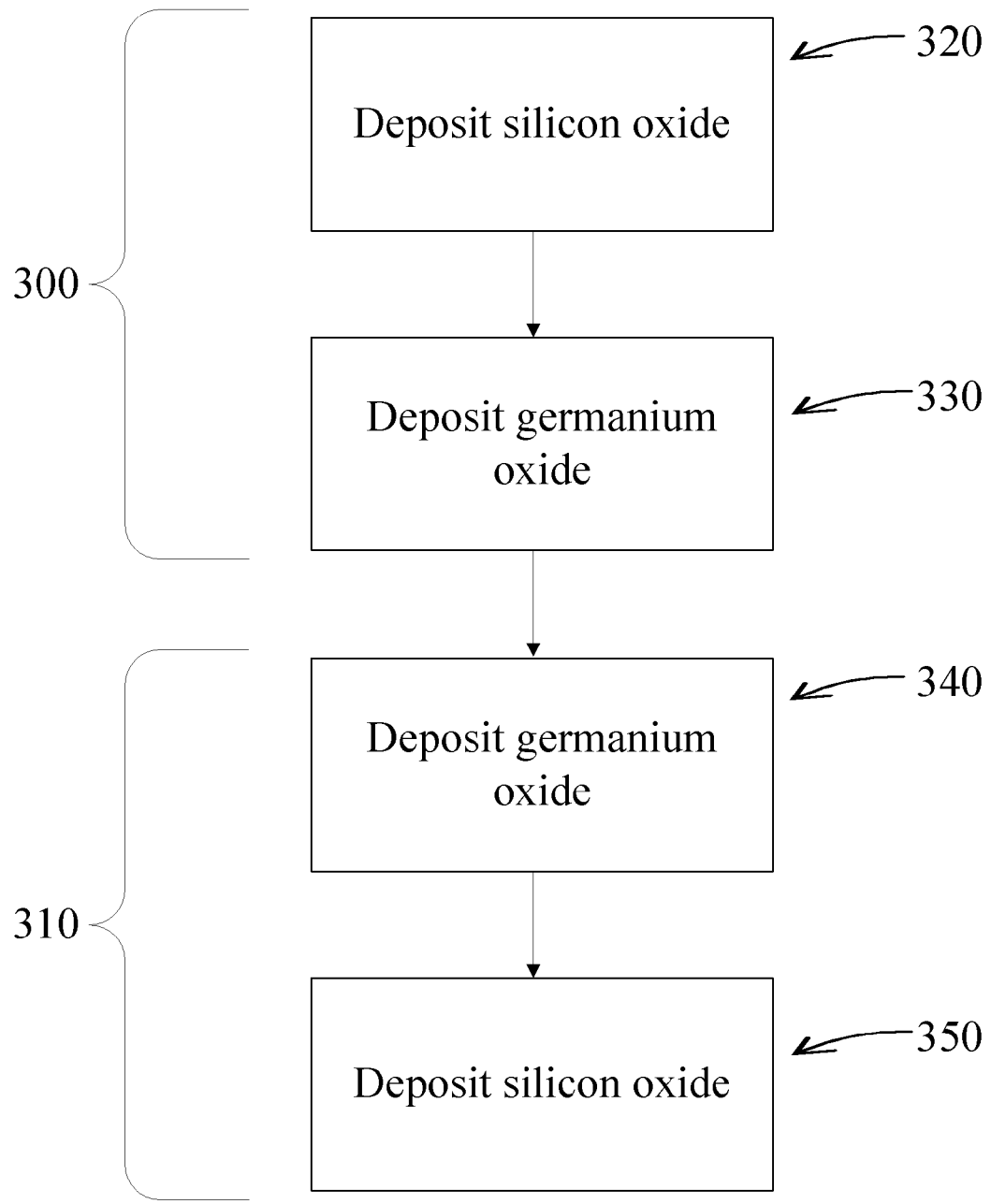
FIG. 3 is a flow chart generally illustrating a method for forming a SiGeO thin film in accordance with some embodiments.

FIG. 3 is a flow chart generally illustrating a SiGeO ALD deposition cycle that can be used to deposit a SiGeO thin film in accordance with some embodiments. According to one embodiment, a SiGeO thin film is formed on a substrate by an ALD type process comprising at least one complete SiGeO deposition cycle 300 and at least one complete $SiO_2/GeO_2$ deposition cycle 310. The process illustrated in FIG. 3 is very similar to the process illustrated in FIG. 2 except that deposition cycle 300 reverses the order of the sub-cycles in that a silicon oxide deposition sub-cycle 320 precedes a germanium oxide sub-cycle 330. Sub-cycle 320 may be repeated any number of times before performing sub-cycle 330, which may itself be repeated any number of times. SiGeO deposition cycle 310 is similar to cycle 210 in that a germanium oxide deposition sub-cycle 340 precedes a silicon oxide deposition sub-cycle 350.

Figure 4:
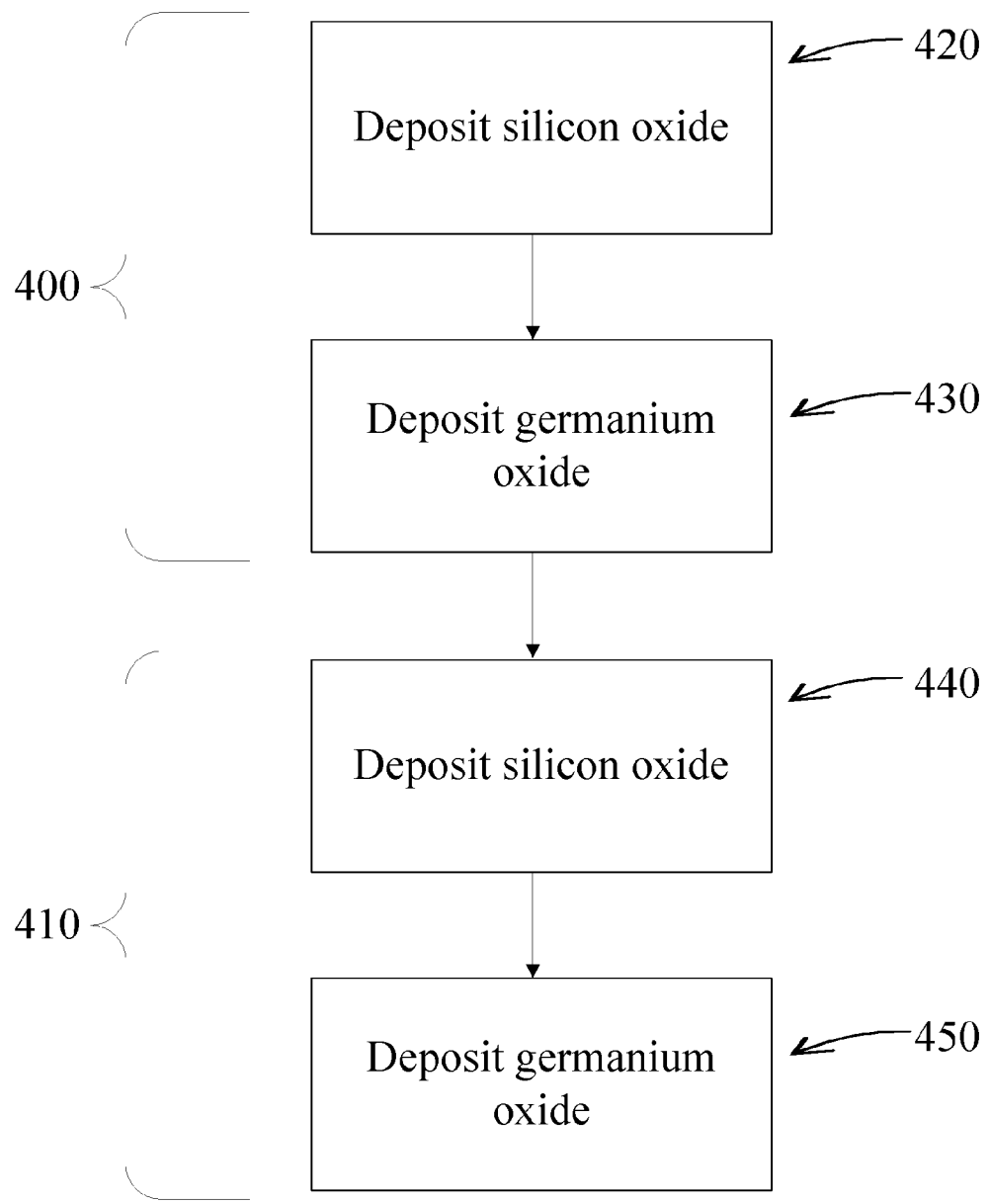
FIG. 4 is a flow chart generally illustrating a method for forming a SiGeO thin film in accordance with some embodiments.

FIG. 4 is a flow chart generally illustrating a SiGeO ALD deposition cycle that can be used to deposit a SiGeO thin film in accordance with some embodiments. According to one embodiment, a SiGeO thin film is formed on a substrate by an ALD type process comprising at least one complete SiGeO deposition cycle 400 and at least one complete SiGeO deposition cycle 410. The process illustrated in FIG. 4 is very similar to the process illustrated in FIG. 3 except that deposition cycle 310 reverses the order of the sub-cycles in that a silicon oxide deposition sub-cycle 440 precedes a germanium oxide sub-cycle 450. Sub-cycle 440 may be repeated any number of times before performing sub-cycle 450, which may itself be repeated any number of times. SiGeO deposition cycle 400 is similar to cycle 300 in that a silicon oxide deposition sub-cycle 420 precedes a germanium oxide deposition sub-cycle 430.

Figure 5:
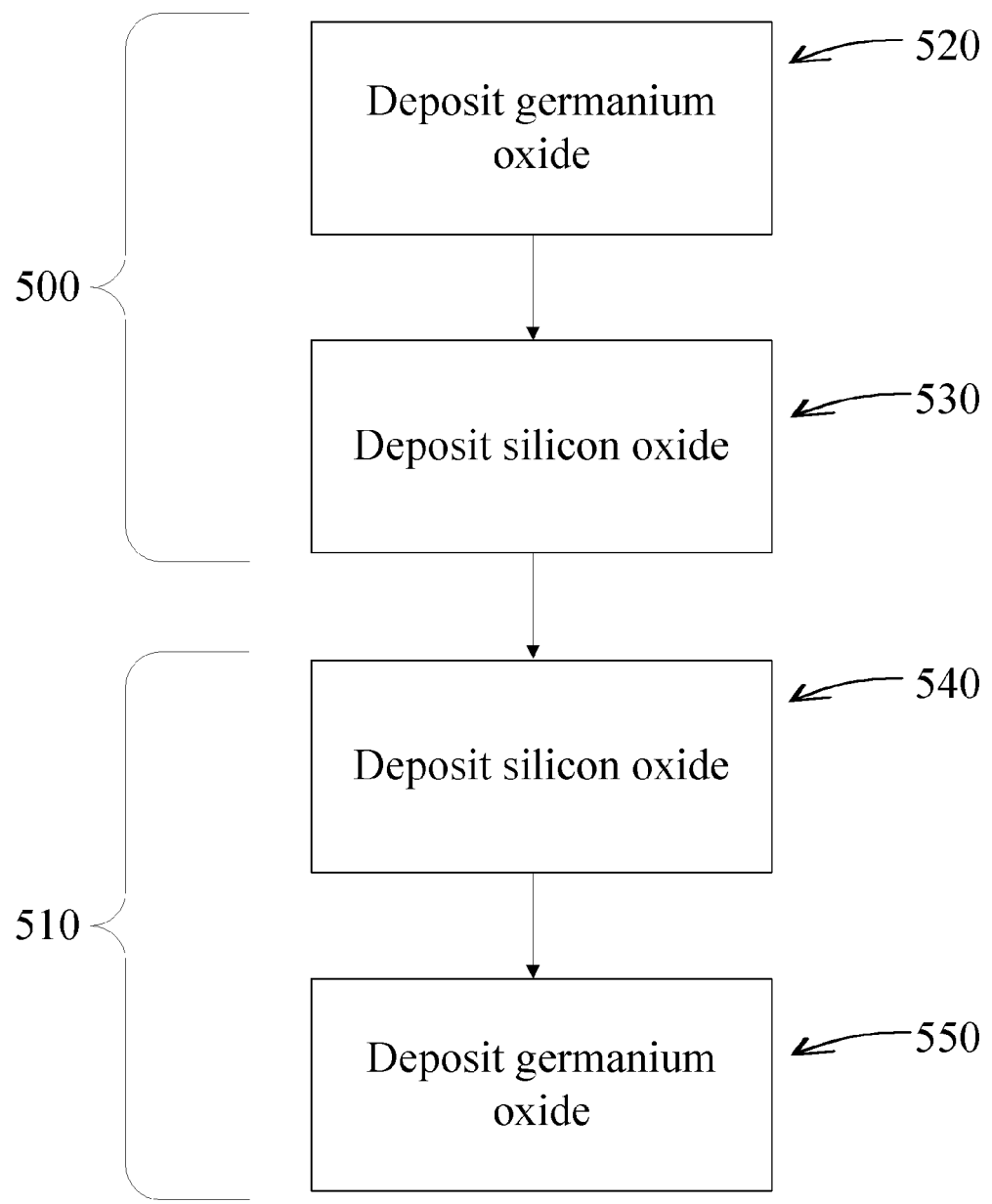
FIG. 5 is a flow chart generally illustrating a method for forming a SiGeO film in accordance with some embodiments.

FIG. 5 is a flow chart generally illustrating a SiGeO ALD deposition cycle that can be used to deposit a SiGeO thin film in accordance with some embodiments. According to one embodiment, a SiGeO thin film is formed on a substrate by an ALD type process comprising at least one complete SiGeO deposition cycle 500 and at least one complete SiGeO deposition cycle 510. The process illustrated in FIG. 5 is very similar to the process illustrated in FIG. 3 except that deposition cycle 510 reverses the order of the sub-cycles in that a silicon oxide deposition sub-cycle 540 precedes a germanium oxide sub-cycle 550. Sub-cycle 540 may be repeated any number of times before performing sub-cycle 550, which may itself be repeated any number of times. $SiO_2/GeO_2$ deposition cycle 500 is similar to cycle 300 in that a silicon oxide deposition sub-cycle 520 precedes a germanium oxide deposition sub-cycle 530.

As mentioned above, in some embodiments the substrate may be contacted simultaneously by multiple reactants, while in other embodiments these reactants are provided separately or overlappingly. In some embodiments, one or more reactants are allowed to decompose or at least partially decompose while in the reaction space.

The various contacting steps are repeated until a thin film of a desired thickness and composition is obtained. Excess reactants may be purged from the reaction space after each contacting step.

Exemplary Reaction Sequences

Figure 6A:
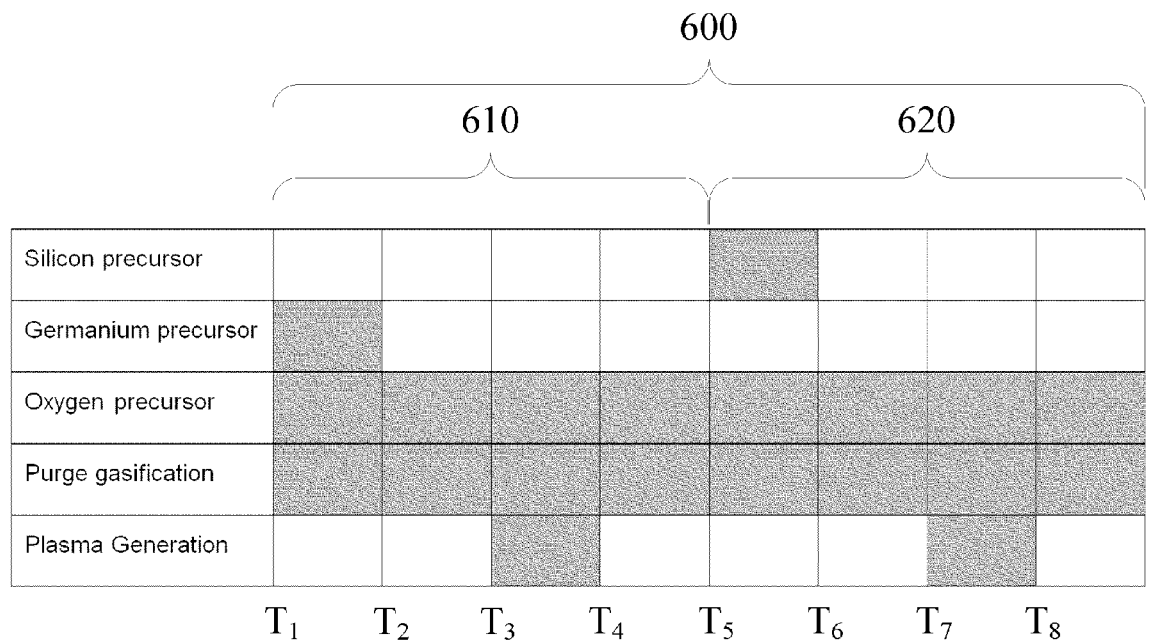
FIGS. 6A-C respectively illustrate exemplary deposition sequences for depositing a SiGeO film in accordance with some embodiments.

FIG. 6A is a chart generally illustrating the pulsing sequence of various reactants in an embodiment of a SiGeO ALD cycle for forming a SiGeO thin film in accordance with some embodiments. According to such embodiments, a SiGeO thin film is formed on a substrate by an ALD type process comprising multiple cycles 600, each cycle 600 comprising a germanium oxide deposition sub-cycle 610 and a silicon oxide deposition sub-cycle 620, each of which may be repeated any number of times before or after the other has been performed any number of times.

Germanium oxide deposition sub-cycle 610 comprises the following sequence:
both an oxygen source ("oxygen precursor") and a purge gas are flowed through a reaction space for the duration of cycle 600;
at time $T_1$, a germanium precursor is pulsed into the reaction space;
at time $T_2$, the flow of germanium precursor into the reaction space is stopped;
between times $T_2$ and $T_3$ excess germanium precursor and reaction byproducts are removed from the reaction space by the flow of both the oxygen precursor and the purge gas;
at time $T_3$, a plasma generator is turned on;
at time $T_4$, the plasma generator is turned off; and
between times $T_4$ and $T_5$ excess reactive species produced by the plasma generator and reaction byproducts are removed from the reaction space by the flow of both the oxygen precursor and the purge gas.

This sequence of sub-cycle 610 may be repeated any number of times before performing sub-cycle 620.

Silicon oxide deposition sub-cycle 620 comprises the following sequence:
at time $T_5$, silicon precursor is pulsed into the reaction space
at time $T_6$, the flow of silicon precursor into the reaction space is stopped;
between times $T_6$ and $T_7$ excess silicon precursor and reaction byproducts are removed from the reaction space by the flow of both the oxygen precursor and the purge gas;
at time $T_7$, a plasma generator is turned on;
at time $T_8$, the plasma generator is turned off; and
after time $T_8$ excess reactive species produced by the plasma generator and reaction byproducts are removed from the reaction space by the flow of both the oxygen precursor and the purge gas.

This sequence of sub-cycle 620 may be repeated any number of times before completing cycle 600. Cycle 600 is repeated until a thin film of a desired thickness and composition is achieved on the substrate surface. The number of times that sub-cycle 610 and sub-cycle 620 are repeated in cycle 600 may vary.

Figure 6B:
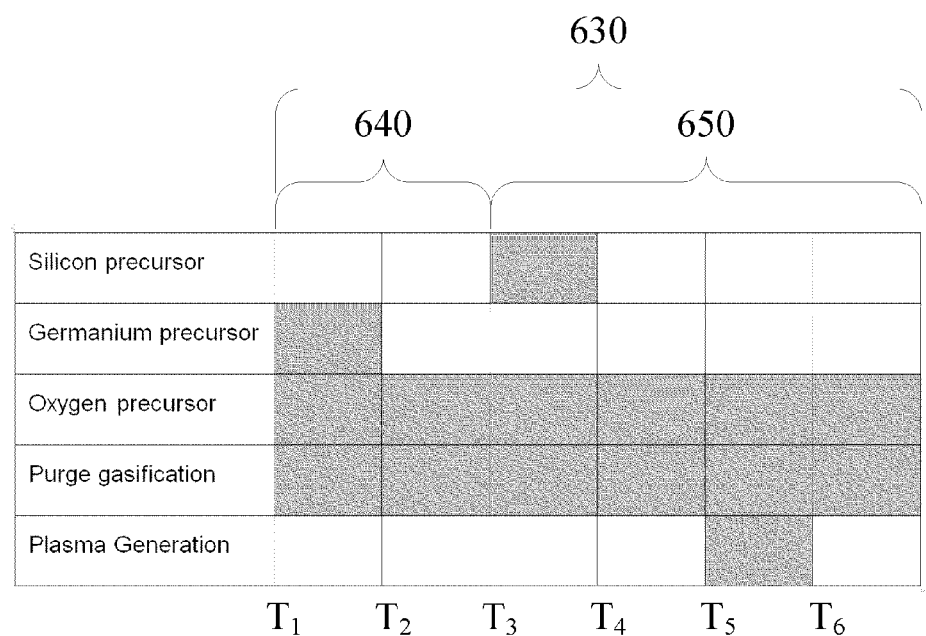

FIG. 6B is a chart generally illustrating the pulsing sequence of various reactants in a SiGeO ALD cycle for forming a SiGeO thin film in accordance with some embodiments. According to such embodiments, a SiGeO thin film is formed on a substrate by an ALD type process comprising multiple cycles 630, each cycle 630 comprising a germanium deposition sub-cycle 640 and a silicon oxide deposition sub-cycle 650, each of which may be repeated any number of times before or after the other has been performed any number of times.

Germanium deposition sub-cycle 640 comprises the following sequence:
both an oxygen precursor and a purge gas are flowed through a reaction space for the duration of cycle 630;
at time $T_1$, a germanium precursor is pulsed into the reaction space;
at time $T_2$, the flow of germanium precursor into the reaction space is stopped;
between times $T_2$ and $T_3$ excess germanium precursor and reaction byproducts are removed from the reaction space by the flow of both the oxygen precursor and the purge gas.

This sequence of sub-cycle 640 may be repeated any number of times before performing sub-cycle 650.

Silicon oxide deposition sub-cycle 650 comprises the following sequence:
at time $T_3$, silicon precursor is pulsed into the reaction space
at time $T_4$, the flow of silicon precursor into the reaction space is stopped;
between times $T_4$ and $T_5$ excess silicon precursor and reaction byproducts are removed from the reaction space by the flow of both the oxygen precursor and the purge gas;
at time $T_5$, a plasma generator is turned on;

at time $T_6$, the plasma generator is turned off; and after time $T_6$ excess reactive species produced by the plasma generator and reaction byproducts are removed from the reaction space by the flow of both the oxygen precursor and the purge gas.

This sequence of sub-cycle 650 may be repeated any number of times before completing cycle 630. Cycle 630 is repeated until a thin film of a desired thickness and composition is achieved on the substrate surface. The number of times sub-cycle 650 and sub-cycle 640 are repeated may vary in one or more of cycle 630.

Figure 6C:
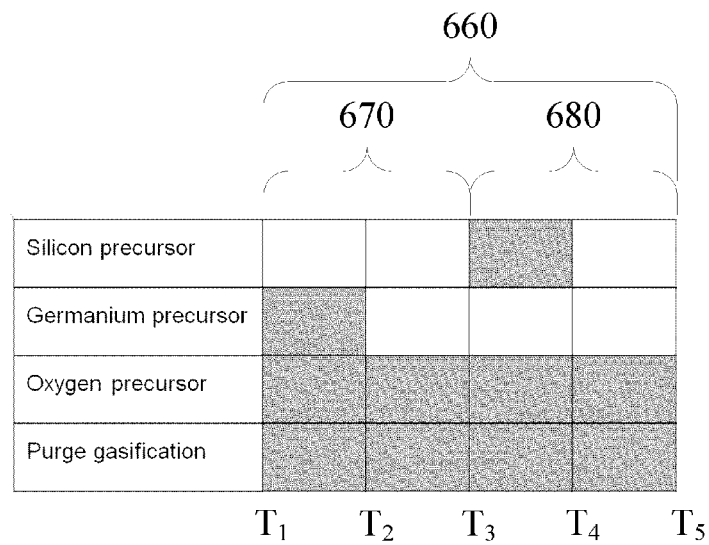

FIG. 6C is a chart generally illustrating the pulsing sequence of various reactants in a SiGeO ALD cycle for forming a SiGeO thin film in accordance with some embodiments. According to such embodiments, a SiGeO thin film is formed on a substrate by an ALD type process comprising multiple cycles 660, each cycle 660 comprising a germanium deposition sub-cycle 670 and a silicon oxide deposition sub-cycle 680, each of which may be repeated any number of times before or after the other has been performed any number of times.

Germanium deposition sub-cycle 670 comprises the following sequence:

both an oxygen precursor and a purge gas are flowed through a reaction space for the duration of cycle 670;

at time $T_1$, a germanium precursor is pulsed into the reaction space;

at time $T_2$, the flow of germanium precursor into the reaction space is stopped;

between times $T_2$ and $T_3$ excess germanium precursor and reaction byproducts are removed from the reaction space by the flow of both the oxygen precursor and the purge gas.

This sequence of sub-cycle 670 may be repeated any number of times before performing sub-cycle 680.

Silicon oxide deposition sub-cycle 680 comprises the following sequence:

at time $T_3$, silicon precursor is pulsed into the reaction space at time $T_4$, the flow of silicon precursor into the reaction space is stopped;

between times $T_4$ and $T_5$ excess silicon precursor and reaction byproducts are removed from the reaction space by the flow of both the oxygen precursor and the purge gas;

This sequence of sub-cycle 680 may be repeated any number of times before completing cycle 660. Cycle 660 is repeated until a thin film of a desired thickness and composition is achieved on the substrate surface. The number of time sub-cycles 670 and 680 are repeated in cycle 660 may vary.

Figure 7A:
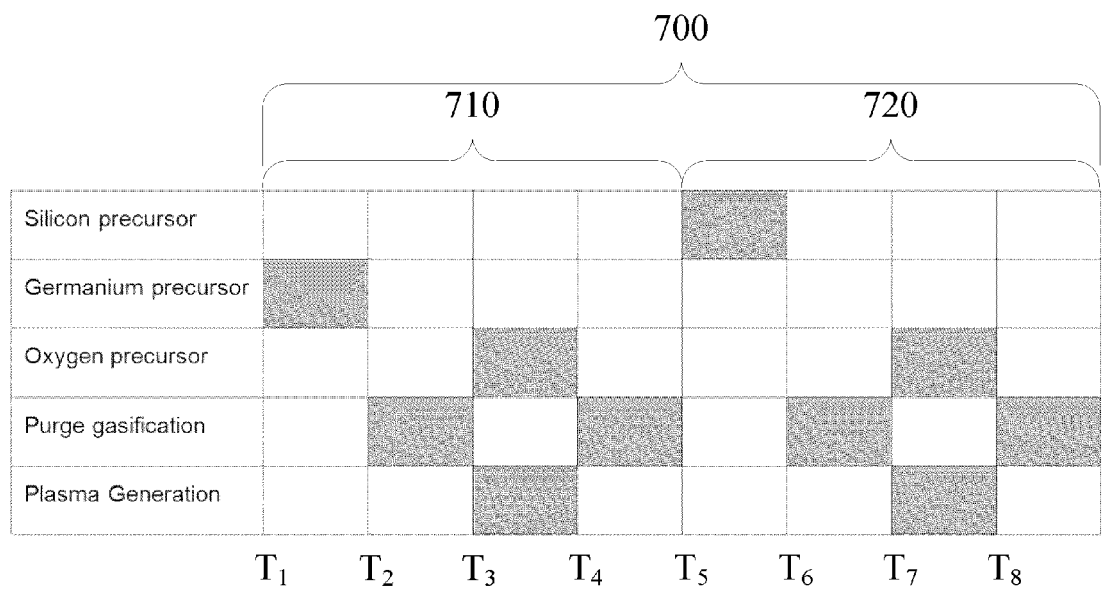
FIGS. 7A-D respectively illustrate exemplary deposition sequences for depositing a SiGeO film in accordance with some embodiments.

FIG. 7A is a chart generally illustrating the pulsing sequence of various reactants in a SiGeO ALD cycle for forming a SiGeO thin film in accordance with some embodiments. According to such embodiments, a SiGeO thin film is formed on a substrate by an ALD type process comprising multiple cycles 700, each cycle 700 comprising a germanium oxide deposition sub-cycle 710 and a silicon oxide deposition sub-cycle 720, each of which may be repeated any number of times before or after the other has been performed any number of times. The number of times each sub-cycle is repeated may vary in one or more cycle 700.

Germanium oxide deposition sub-cycle 710 comprises the following sequence:

at time $T_1$, a germanium precursor is pulsed into a reaction space;

at time $T_2$, the flow of germanium precursor into the reaction space is stopped, and a purge gas is flowed through the reaction space to remove excess germanium precursor and reactant byproducts from the reaction space;

at time $T_3$, the flow of purge gas is stopped, and an oxygen source ("oxygen precursor") is flowed through the reaction space and a plasma generator is turned on to generate oxygen radicals from the oxygen precursor; and at time $T_4$, the flow of oxygen precursor is stopped and the plasma generator is turned off, and a purge gas is flowed through the reaction space to remove excess reactive species and reactant byproducts from the reaction space.

This sequence of sub-cycle 710 may be repeated any number of times before performing sub-cycle 720.

Silicon oxide deposition sub-cycle 720 comprises the following sequence:

at time $T_5$, a silicon precursor is pulsed into a reaction space;

at time $T_6$, the flow of silicon precursor into the reaction space is stopped, and a purge gas is flowed through the reaction space to remove excess silicon precursor and reactant byproducts from the reaction space;

at time $T_7$, the flow of purge gas is stopped, and the oxygen precursor is flowed through the reaction space and a plasma generator is turned on to generate oxygen radicals from the oxygen precursor; and at time $T_8$, the flow of oxygen precursor is stopped and the plasma generator is turned off, and a purge gas is flowed through the reaction space to remove excess reactive species and reactant byproducts from the reaction space.

This sequence of sub-cycle 720 may be repeated any number of times before completing cycle 700. Cycle 700 is repeated until a thin film of a desired thickness and composition is achieved on the substrate surface.

Figure 7B:
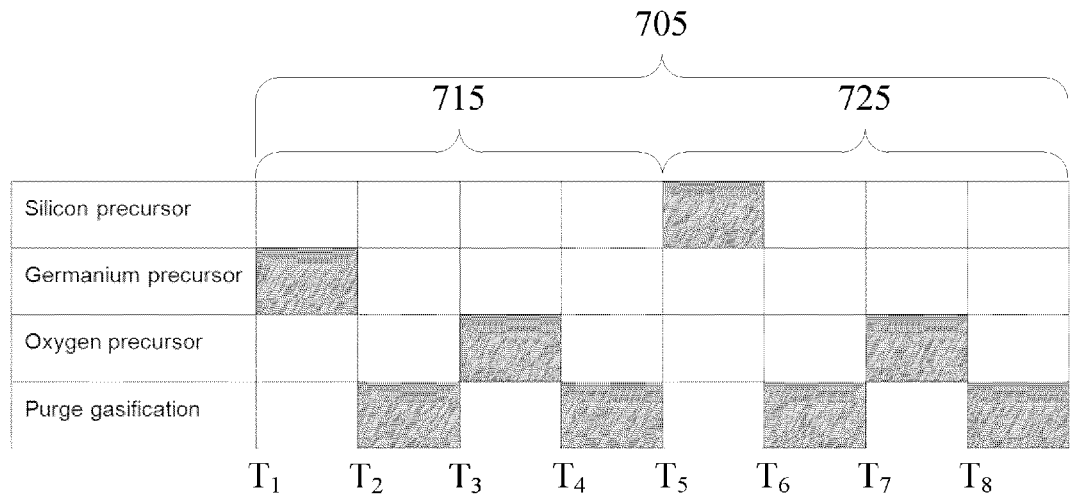

FIG. 7B is a chart generally illustrating the pulsing sequence of various reactants in a SiGeO ALD cycle for forming a SiGeO thin film in accordance with some embodiments. According to such embodiments, a SiGeO thin film is formed on a substrate by an ALD type process comprising multiple cycles 705, each cycle 705 comprising a germanium oxide deposition sub-cycle 715 and a silicon oxide deposition sub-cycle 725, each of which may be repeated any number of times before or after the other has been performed any number of times. The number of sub-cycles 715 and 725 may vary in one or more of cycle 705.

Germanium oxide deposition sub-cycle 715 comprises the following sequence:

at time $T_1$, a germanium precursor is pulsed into a reaction space;

at time $T_2$, the flow of germanium precursor into the reaction space is stopped, and a purge gas is flowed through the reaction space to remove excess germanium precursor and reactant byproducts from the reaction space;

at time $T_3$, the flow of purge gas is stopped, and an oxygen precursor is flowed through the reaction space and reacts with the deposited germanium precursor; and at time $T_4$, the flow of oxygen precursor is stopped, and a purge gas is flowed through the reaction space to remove excess oxygen precursor and reaction byproducts from the reaction space.

This sequence of sub-cycle 715 may be repeated any number of times before performing sub-cycle 725.

Silicon oxide deposition sub-cycle 725 comprises the following sequence:

at time $T_5$, a silicon precursor is pulsed into a reaction space;

at time $T_6$, the flow of silicon precursor into the reaction space is stopped, and a purge gas is flowed through the reaction space to remove excess silicon precursor and reactant byproducts from the reaction space;

at time $T_7$, the flow of purge gas is stopped, and an oxygen precursor is flowed through the reaction space and reacts with the deposited silicon precursors; and at time $T_8$, the flow of oxygen precursor is stopped, and a purge gas is flowed through the reaction space to remove excess oxygen precursor and reactant byproducts from the reaction space.

This sequence of sub-cycle 725 may be repeated any number of times before completing cycle 705. Cycle 705 is repeated until a thin film of a desired thickness and composition is achieved on the substrate surface.

Figure 7C:
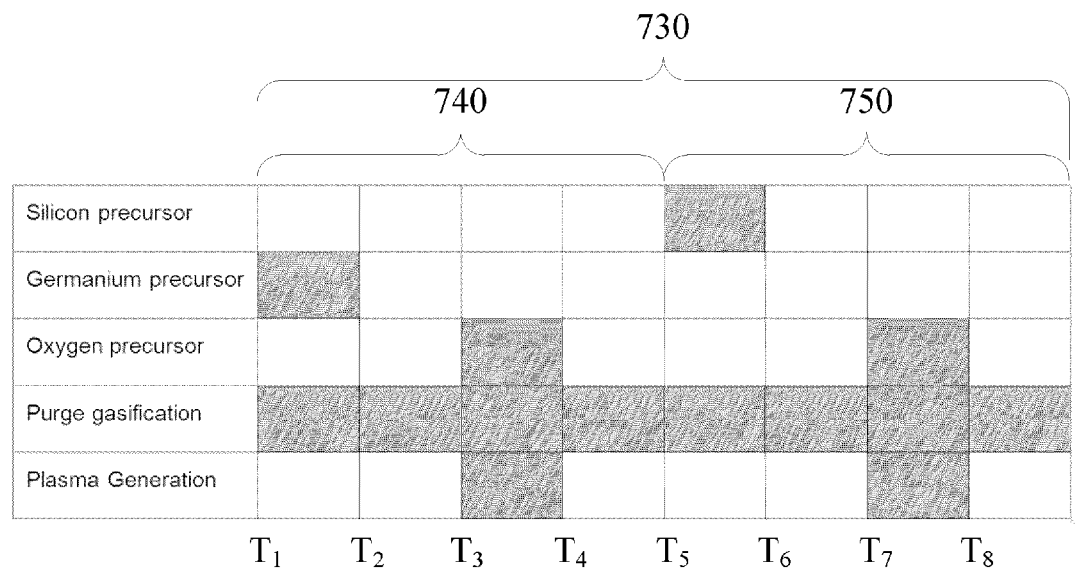

FIG. 7C is a chart generally illustrating the pulsing sequence of various reactants in a SiGeO ALD cycle for forming a SiGeO thin film in accordance with some embodiments. According to such embodiments, a SiGeO thin film is formed on a substrate by an ALD type process comprising multiple cycles 730, each cycle 730 comprising a germanium oxide deposition sub-cycle 740 and a silicon oxide deposition sub-cycle 750, each of which may be repeated any number of times before or after the other has been performed any number of times. The number of times sub-cycles 740 and 750 are repeated in each cycle 730 may vary.

Germanium oxide deposition sub-cycle 740 comprises the following sequence:

a purge gas is flowed through a reactor space throughout the duration of cycle 730;

at time $T_1$, a germanium precursor is pulsed into the reaction space;

at time $T_2$, the flow of germanium precursor into the reaction space is stopped, and excess germanium precursor and reactant byproducts are removed from the reaction space by the continuous flow of the purge gas;

at time $T_3$, an oxygen source ("oxygen precursor") is flowed through the reaction space and a plasma generator is turned on to generate oxygen radicals from the oxygen precursor; and at time $T_4$, the flow of oxygen precursor is stopped and the plasma generator is turned off, and excess reactive species and reactant byproducts are removed from the reaction space by the continuous flow of the purge gas.

This sequence of sub-cycle 740 may be repeated any number of times before performing sub-cycle 750.

Silicon oxide deposition sub-cycle 720 comprises the following sequence:

at time $T_5$, a germanium precursor is pulsed into the reaction space;

at time $T_6$, the flow of germanium precursor into the reaction space is stopped, and excess germanium precursor and reactant byproducts are removed from the reaction space by the continuous flow of the purge gas;

at time $T_7$, the oxygen precursor is flowed through the reaction space and a plasma generator is turned on to generate oxygen radicals from the oxygen precursor; and at time $T_8$, the flow of oxygen precursor is stopped and the plasma generator is turned off, and excess reactive species and reactant byproducts are removed from the reaction space by the continuous flow of the purge gas.

This sequence of sub-cycle 750 may be repeated any number of times before completing cycle 730. Cycle 730 is repeated until a thin film of a desired thickness and composition is achieved on the substrate surface.

Figure 7D:
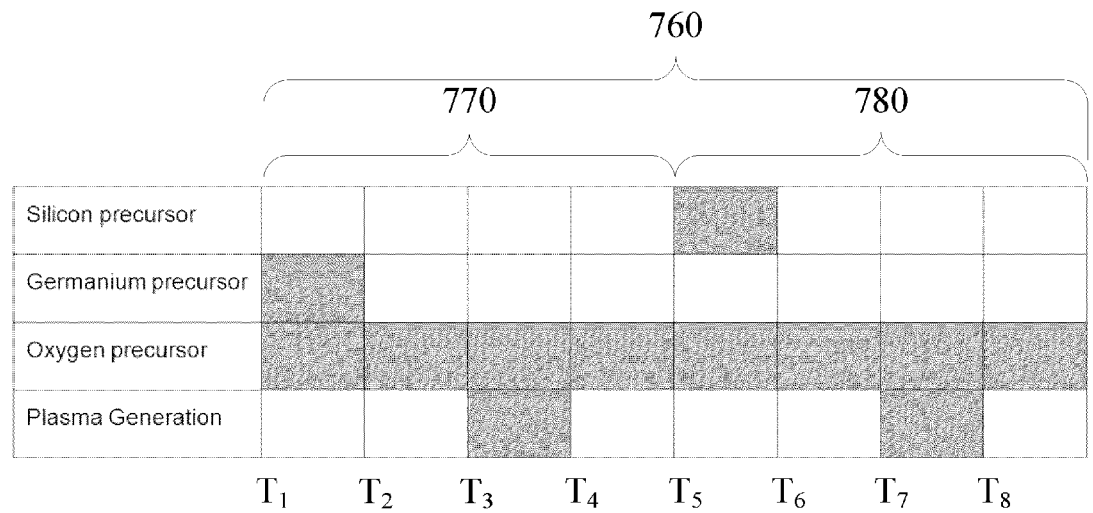

FIG. 7D is a chart generally illustrating the pulsing sequence of various reactants in a SiGeO ALD cycle for forming a SiGeO thin film in accordance with some embodiments. According to such embodiments, a SiGeO thin film is formed on a substrate by an ALD type process comprising multiple cycles 760, each cycle 760 comprising a germanium oxide deposition sub-cycle 770 and a silicon oxide deposition sub-cycle 780, each of which may be repeated any number of times before or after the other has been performed any number of times. The number of times sub-cycles 760 and 770 are carried out in each cycle 760 may vary.

Germanium oxide deposition sub-cycle 770 comprises the following sequence:

an oxygen source ("oxygen precursor") is flowed through a reactor space throughout the duration of cycle 790;

at time $T_1$, a germanium precursor is pulsed into the reaction space;

at time $T_2$, the flow of germanium precursor into the reaction space is stopped, and excess germanium precursor and reactant byproducts are removed from the reaction space by the continuous flow of the oxygen reactant gas;

at time $T_3$, an a plasma generator is turned on to generate oxygen radicals from the oxygen source gas that is flowing continuously through the reaction space; and at time $T_4$, the plasma generator is turned off, and excess reactive species and reactant byproducts are removed from the reaction space by the continuous flow of the oxygen source gas.

The sequence of sub-cycle 770 may be repeated any number of times before performing sub-cycle 780.

Silicon oxide deposition sub-cycle 780 comprises the following sequence:

an oxygen source gas is flowed through a reactor space throughout the duration of cycle 790;

at time $T_5$, a silicon precursor is pulsed into the reaction space;

at time $T_6$, the flow of silicon precursor into the reaction space is stopped, and excess silicon precursor and reactant byproducts are removed from the reaction space by the continuous flow of the oxygen reactant gas;

at time $T_7$, an a plasma generator is turned on to generate oxygen radicals from the oxygen source gas that is flowing continuously through the reaction space; and at time $T_8$, the plasma generator is turned off, and excess reactive species and reactant byproducts are removed from the reaction space by the continuous flow of the oxygen source gas.

The sequence of sub-cycle 780 may be repeated any number of times before completing cycle 760. Cycle 760 is repeated until a thin film of a desired thickness and composition is achieved on the substrate surface.

As shown above, in some embodiments the oxygen source gas may flow continuously throughout the cycle, with oxygen plasma formed intermittently to convert the adsorbed silicon or germanium compound into silicon oxide and germanium oxide, respectively. In some embodiments oxygen plasma is generated remotely and provided to the reaction space.

As discussed above, the deposition process typically comprises multiple ALD deposition cycles. In some embodiments, the oxygen reactant is provided in every deposition cycle. In other embodiments, however, the oxygen reactant may be provided in only a portion of the deposition cycles.

As discussed above, the ratio of silicon oxide deposition sub-cycles to germanium oxide sub-cycles may be selected to control the composition of the ultimate film deposited by the PEALD process. For example, for a low germanium density, the ratio of germanium sub-cycles to silicon sub-cycles may be on the order of 1:20. For a higher concentration of germanium, the ratio may range up to about 1:1 or higher such as 2:1, 4:1, 6:1, 10:1, 15:1, 20:1, etc. The composition of the resulting thin film may also be determined by controlling the exposure time of each reactant to the substrate.

By controlling the ratio of germanium precursor cycle to silicon precursor cycle, the germanium concentration can be controlled from a density range of about 0 atoms of germanium to about $2.43E22/cm^3$ atoms of germanium. Density may be measured, for example, by SIMS (secondary-ion-probe mass spectrometry).

In addition, the germanium density can be varied across the thickness of the film by changing the ratio of germanium precursor cycles to silicon precursor cycles during the deposition process. For example, a high density of germanium may be provided near the substrate surface (lower ratio of silicon precursor cycles to germanium precursor cycle), such as near a Si surface (corresponding to the bottom of the SiGeO surface) and the density of germanium at the top surface away from the substrate may be low (higher ratio of silicon precursor cycles to germanium precursor cycles). In other embodiments a high density of germanium may be provided at the top surface with a lower density near the substrate surface.

The ability to adjust the ratio of sub-cycles is illustrated in FIG. 2, which shows at least two cycles, cycle 200 and cycle 210, each of which comprises at least two sub-cycles. Where a higher density of germanium is desired near a substrate surface, cycle 200 may comprise a higher number of germanium oxide deposition sub-cycles 220 than silicon oxide deposition sub-cycles 230. Cycle 200, with its higher germanium content, may be repeated a desired number of times, after which cycle 210 is commenced. In contrast to cycle 200, cycle 210 may include fewer germanium oxide deposition sub-cycles 240 relative to the silicon oxide deposition sub-cycles 250. Cycle 210 is then repeated a desired number of times. One or more additional cycles may be commenced after completing cycle 210. In this way a gradient in the concentration of germanium or silicon is achieved in the resulting thin film.

Deposition temperatures are maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved.

The deposition processes can be carried out at a wide range of pressure conditions, but it is preferred to operate the process at reduced pressure. The pressure in the reaction chamber is typically from about 0.1 Pa to about 50000 Pa or more. However, in some cases the pressure will be higher or lower than this range, as can be readily determined by the skilled artisan. The pressure in a single wafer reactor is preferably maintained between about 50 Pa and 1000 Pa, preferably between about 100 Pa and 600 Pa and more preferably between about 150 Pa and 500 Pa. In some embodiments, the pressure in a batch ALD reactor is preferably maintained between about 0.1 Pa and 70 Pa, more preferably between about 4 Pa and about 25 Pa.

The reactant source temperature, such as the silicon or germanium source temperature, is preferably set below the deposition or substrate temperature. This is based on the fact that if the partial pressure of the source chemical vapor exceeds the condensation limit at the substrate temperature, controlled layer-by-layer growth of the thin film is compromised.

In some embodiments, the silicon and germanium source temperatures are from about 20° C. to about 150° C. or from about 20° C. to about 100° C. In some embodiments, the silicon and germanium source temperatures are about 20° C. or about 70° C. For example, in some single wafer processes the silicon and germanium sources may be between about room temperature and about 100° C. The silicon and germanium sources may be about the same or different temperatures.

In some embodiments the growth rate of the thin films, such as thin films comprising SiGeO is preferably from about 0.8 to about 2.0 Å/cycle. In other embodiments the growth rate is about 1.0 to about 1.5 Å/cycle. In some embodiments, the growth rate of a germanium oxide sub-cycle is between about 0.2 and 0.6 Å/cycle, and the growth rate of a silicon oxide sub-cycle is between about 0.4 and 0.8 Å/cycle. In some embodiments, the growth rates of a germanium oxide sub-cycle and a silicon oxide sub-cycle are 0.4 and 0.6 Å/cycle, respectively.

In some embodiments, the deposited thin films, such as the SiGeO thin films, are deposited on a three dimensional structure and have step coverage of greater than about 80%, greater than about 90%, greater than about 95% or step coverage of about 100%.

In some embodiments the thin films, such as the SiGeO films, are deposited to a thickness of 5 nm or less or 10 nm or less. However, in some situations SiGeO films of greater thickness, such as 10 nm or more, 30 nm or more, 50 nm or more or even 100 nm or more may be deposited. The specific thickness can be selected by the skilled artisan based on the particular circumstances.

Wet Etch Rate

According to some embodiments silicon germanium films with various WERs may be deposited. When using a blanket WER in 0.5% dHF (nm/min), silicon germanium films may have WER values of between 4 nm/min and 1000 nm/min. When using a blanket WER in 0.1% dHF (nm/min), silicon germanium films may have WER values of between 1 nm/min and 700 nm/min. The WER relative to thermal oxide (i.e., WERR) of some embodiments is between about 2 and 450.

In some embodiments having a higher concentration of germanium, higher WERRs are achieved. Such results may be achieved by increasing the number of germanium oxide sub-cycles relative to the number of silicon oxide sub-cycles. For example, the WERRs of some SiGeO films may be greater than about 20, 40, 60, 80, 100, etc.

In some embodiments having a lower concentration of germanium, lower WERRs are achieved. Such results may be achieved by increasing the number of silicon oxide sub-cycles relative to the number of germanium oxide sub-cycles. For example, the WERRs of some SiGeO films may be less than about 10, 6, 5, 4, or 3.

In some embodiments, methods of depositing a silicon germanium oxide film comprise loading a substrate comprising at least one three-dimensional feature into a reaction space, depositing alternating layers of silicon oxide and germanium oxide to form a silicon germanium oxide thin film. In some embodiments the film has a step coverage of more than about 50% on the three-dimensional feature. In some embodiments the WER of the silicon germanium oxide film is between about 3 nm/min and about 700 nm/min in 0.1% aqueous DHF. In some embodiments a ratio of an etch rate of the silicon germanium oxide film in a sidewall of a three-dimensional structure to an etch rate on a top surface is between about 2 and about 450. In some embodiments the step coverage is at least about 80%, 90%, or 95%.

Silicon Source Materials

In general, the source materials, (e.g., silicon source materials and germanium source materials), are preferably selected to have sufficient vapor pressure, sufficient thermal stability at substrate temperature, and sufficient reactivity of the compounds for effecting deposition by ALD. "Sufficient vapor pressure" typically supplies enough source chemical molecules in the gas phase to the substrate surface to enable self-saturated reactions at the surface at the desired rate. "Sufficient thermal stability" typically means that the source chemical itself does not form growth-disturbing condensable phases on the surface or leave harmful level of impurities on the substrate surface through thermal decomposition. In other words, temperatures are kept above the condensation limits and below the thermal decomposition limits of the selected reactant vapors. One aim is to avoid uncontrolled condensation of molecules on the substrate. "Sufficient reactivity" typically results in self-saturation in pulses short enough to allow for a commercially acceptable throughput time. Further selection criteria include the availability of the chemical at high purity and the ease of handling of the chemical.

In some embodiments the silicon precursor is an aminosilane or an aminesilane.

In some embodiments the silicon precursor comprises aminosilane, where the silicon is bonded to one nitrogen atom and three hydrogen atoms. For example, the silicon precursor may comprise dialkylaminesilane, $(R_2N)Si-H_3$.

In some embodiments the silicon precursor comprises a silicon amine, where silicon is bonded to two nitrogen atoms and two hydrogen atoms. For example, the silicon precursor may comprise bis(dialkylamine)silane, $(R_2N)_2Si-H_2$. In some embodiments the silicon precursor comprises BDEAS (=bis(diethylamino)silane).

In some embodiments the silicon precursor comprises a silicon amine, where silicon is bonded to three nitrogen atoms and one hydrogen atom. For example, the silicon precursor may comprise tris(dialkylamine)silane, $(R_2N)_3Si-H_1$.

In some embodiments, the silicon precursor comprises a silicon amine, where silicon is bonded to four nitrogen atoms. For example, the silicon precursor may comprise tetrakis (dialkylamine)silane, $(R_2N)_4Si$.

Organic compounds having a Si—Si bond and an $NH_x$ group either attached directly to silicon (to one or more silicon atoms) or to a carbon chain attached to silicon are used in some embodiments. In some embodiments, the silicon precursor may comprise an aminodisilane, such as hexakis(ethylamino)disilane. In some embodiments the silicon compound may have the formula:

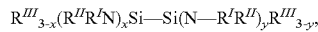

wherein the
x is selected from 1 to 3;
y is selected from 1 to 3;
$R^I$ is selected from the group consisting of hydrogen, alkyl, and substituted alkyl;
$R^{II}$ is selected from the group consisting of alkyl and substituted alkyl; and
$R^{III}$ is selected from the group consisting of hydrogen, hydroxide (—OH), amino (—NH₂), alkoxy, alkyl, and substituted alkyl;
and wherein the each x, y, $R^{III}$, $R^{II}$ and $R^I$ can be selected independently from each other.

In some embodiments the silicon compound is hexakis (monoalkylamino)disilane:

In other embodiments the silicon compound is $(CH_3-O)_3Si-Si(O-CH_3)_3$.

In some embodiments, the silicon source is selected from the following: $(SiH_3)_3N$; $(SiH_3)_2$; $(SiH_3)_2NMe$; $(SiH_3)_2NEt$; $(SiH_3)_2N(iPr)$; $(SiH_3)_2N(tBu)$; $SiH_3NEt_2$; $SiH_3N(iPr)_2$; $SiH_3N(tBu)_2$; $SiH_2(NEt_2)_2$; $SiH_2(NMe_2)_2$; $SiH_2(NHtBu)_2$; $SiH_2(NHSiMe_3)_2$; $Si(OEt)_4$; $SiCl_4$; $Si_2Cl_6$; $SiH_2Cl_2$; $SiH(N(Me)_2)_3$; $SiH_2[N(Et)(Me)]_2$; $Si_2(NHEt)_6$; $Si(NHEt)_4$; and $Si_3H_8$.

Germanium Source Materials

A number of different Ge precursors can be used in the ALD processes. In some embodiments the Ge precursor is tetravalent (i.e. Ge has an oxidation state of +IV). In some embodiments, the Ge precursor is not divalent (i.e., Ge has an oxidation state of +II). In some embodiments, the Ge precursor may comprise at least one alkoxide ligand. In some embodiments, the Ge precursor may comprise at least one amine or alkylamine ligand. In some embodiments the Ge precursor is a metal-organic or organometallic compound. In some embodiments the Ge precursor comprises at least one halide ligand. In some embodiments the Ge precursor does not comprise a halide ligand.

In some embodiments the Ge precursor is not solid at room temperature (e.g., about 20° C.).

For example, Ge precursors from formulas (1) through (9) below may be used in some embodiments.

Wherein R is can be independently selected from the group consisting of alkyl and substituted alkyl;

Wherein the x is an integer from 1 to 4;
R is an organic ligand and can be independently selected from the group consisting of alkoxides, alkylsilyls, alkyl, substituted alkyl, alkylamines; and
A can be independently selected from the group consisting of alkyl, substituted alkyl, alkoxides, alkylsilyls, alkyl, alkylamines, halide, and hydrogen.

Wherein the x is an integer from 1 to 4;
R can be independently selected from the group consisting of alkyl and substituted alkyl; and
A can be independently selected from the group consisting of alkyl, alkoxides, alkylsilyls, alkyl, substituted alkyl, alkylamines, halide, and hydrogen.

Wherein $R^I$ can be independently selected from the group consisting of hydrogen, alkyl and substituted alkyl; and
$R^{II}$ can be independently selected from the group consisting of alkyl and substituted alkyl;

Wherein the x is an integer from 1 to 4;
$R^I$ can be independently selected from the group consisting of hydrogen, alkyl and substituted alkyl; and
$R^{II}$ can be independently selected from the group consisting of alkyl and substituted alkyl;
A can be independently selected from the group consisting of alkyl, alkoxides, alkylsilyls, alkyl, substituted alkyl, alkylamines, halide, and hydrogen.

Wherein the n is an integer from 1 to 3;
$R^I$ can be independently selected from the group consisting of hydrogen, alkyl and substituted alkyl; and
$R^{II}$ can be independently selected from the group consisting of alkyl and substituted alkyl;

Wherein the n is an integer from 1 to 3; and

Wherein R can be independently selected from the group consisting of alkyl and substituted alkyl;

$$Ge_n R_{2n+2} \quad (8)$$

Wherein the n is an integer from 1 to 3; and

R is an organic ligand and can be independently selected from the group consisting of alkoxides, alkylsilyls, alkyl, substituted alkyl, alkylamines.

$$A_{3-x}R_x Ge\text{---}GeR_y A_{3-y} \quad (9)$$

Wherein the x is an integer from 1 to 3;

y is an integer from 1 to 3;

R is an organic ligand and can be independently selected from the group consisting of alkoxides, alkylsilyls, alkyl, substituted alkyl, alkylamines; and A can be independently selected from the group consisting of alkyl, alkoxides, alkylsilyls, alkyl, substituted alkyl, alkylamines, halide, and hydrogen.

Preferred options for R include, but are not limited to, methyl, ethyl, propyl, isopropyl, n-butyl, isobutyl, tertbutyl for all formulas, more preferred in ethyl and methyl. In some embodiments, the preferred options for R include, but are not limited to, $C_3$-$C_{10}$ alkyls, alkenyls, and alkynyls and substituted versions of those, more preferably $C_3$-$C_6$ alkyls, alkenyls, and alkenyls and substituted versions of those.

In some embodiments the Ge precursor comprises one or more halides. Preferably the precursor comprises 1, 2, or 3 halide ligands. However, as mentioned above, in some embodiments the Ge precursor used in the ALD process does not comprise a halide.

In some embodiments, a Ge precursor that comprises an alkoxide is not used in combination with water in an ALD process. In other embodiments, an amine/akylyamine or Ge—N bond containing Ge precursor may be used in combination with water. Preferred alkylamine Ge precursors include, but are not limited to, tetrakis(dimethylamino) germanium (TDMAGe), tetrakis(diethylamino) germanium (TDEAGe), and tetrakis(ethylmethylamino) germanium (TEMAGe). In some embodiments the Ge precursor is TDMAGe. In some embodiments the precursor is TDEAGe. In some embodiments the precursor is TEMAGe.

According to some embodiments, a germanium precursor is selected from the following: TDMAGe, $Ge(NMe_2)_4$; TEMAGe, $Ge(NEtMe)_4$; $Ge(NEt_2)_4$, $iPr_3GeCl$, $iPr_3GeNMe_2$, $iPr_3GeNEtMe$, and $iPr_3G$.

Other Materials

In some embodiments, the oxygen reactant gas can be selected from the following $O_2$, $O_3$, $H_2O$, $H_2O_2$, $N_2O$, NO, $NO_2$, $CO_2$, a plasma generated from one or more of these, or combination thereof.

As discussed above, in some embodiments oxygen plasma is used as the reactive oxygen reactant species for forming silicon oxide and/or germanium oxide. Oxygen plasma may be generated in the reaction chamber, for example from $O_2$ that is flowed into the reaction chamber. In some embodiments oxygen plasma is generated in the vicinity of the substrate, for example above the substrate. In some embodiments oxygen plasma is generated outside of the vicinity of the substrate. For example, oxygen plasma may be generated remotely, outside of the reaction chamber. In some embodiments thermal ALD is used and reactive species of oxygen, for example ozone or nitrogen oxides $NO_x$, wherein x is from about 0.5 to about 3, which are not excited, are used.

According to some embodiments, a purge gas comprises an inert gas, for example at least one of the following: Ar, He, $N_2$, or combinations thereof. In some embodiments, oxygen may serve as a purge gas. The oxygen purge gas may comprise an oxygen reactant that is energized during some periods but not during others so as to serve as a purge gas.

Applications

Although the methods disclosed herein could be applied by a skilled artisan to any number of useful applications, the following applications are specifically mentioned to provide some example contexts where the advantages of these methods are readily apparent. For example, the methods disclosed herein are useful for depositing SiGeO thin films to be used as a lining feature, for gap filling, trench filling, formation of an inter-layer of high-K/Ge material on the Ge channel, an inter-layer of SiGeO as a capping layer, or a wide-range selective etching layer. The methods disclosed herein are also useful for forming sacrificial layers, patterning layers, mask layers, layers for use in photolithography, layers used to increase etch selectivity, tunable etch rate layers, layers for forming gap layers, etc.

The methods and materials described herein can provide films with increased quality and improved etch properties not only for traditional lateral transistor designs, with horizontal source/drain (S/D) and gate surfaces, but can also provide improved etch properties for use on non-horizontal (e.g., vertical) surfaces, and on complex three-dimensional (3D) structures. In certain embodiments, SiGeO films are deposited by the disclosed methods on a three-dimensional structure during integrated circuit fabrication. The three-dimensional transistors may include, for example, double-gate field effect transistors (DG FET), and other types of multiple gate FETs, including FinFETs. For example, the silicon germanium oxide thin films of the present disclosure may be useful in nonplanar multiple gate transistors, such as FinFETs, where it may be desirable to form layers on vertical walls, in addition to the tops of the gate, source, and drain regions.

The SiGeO films of the present disclosure are particularly suitable for applications requiring a sacrificial layer. For this reason the WER of the films is an important factor to consider.

The SiGeO thin films can exhibit particular etching selectivity compared with SiO or SiN films in different etchant such as DHF, SC-1, SC-2, phosphorus acid, and others. Such a property may be advantageous in certain semiconductor manufacturing operations. Also, the composition of the SiGeO films can be adjusted to achieve lower WERRs. Thus, the same materials can be used to achieve films having either low or high WERRs depending on the ratios of silicon and germanium in the resulting films.

While the reason for this behavior is not entirely known, without being held to any particular hypothesis, it is supposed that the bonding structure of Si—O—Si, Si—O—Ge and Ge—O—Ge (and others) change dramatically when different ratios of SiO:GeO are used.

Because of the wide range of achievable WERs, the SiGeO films of some embodiments may be advantageously used in forming air gap layers to be used in applications, such as DRAM applications. Because of the high WERs achievable by some embodiments, it is possible to deposit the films and later selectively etch the film away to create an air gap or other beneficial void space. Alternatively, some SiGeO films having low WERs as disclosed herein may be used where it is desired to etch away other materials, such as materials having an etch rate lower than traditional thermal oxide. In this way, a material may be protected by first depositing a film of SiGeO, etching surrounding materials, and then removing the SiGeO film.

EXAMPLES

According to some embodiments, a SiGeO thin film is formed by alternately depositing a $GeO_2$ layer and a $SiO_2$ layer, as described above. In some embodiments, tetrakis-dimethylamino germanium is used as germanium source, and bis-diethylaminosilane is used as a silicon source. In many embodiments, the PEALD process contains four process steps: (1) feed time of material gas, (2) purge time, (3) RF time, and (4) after RF plasma ignition purge. Each process step can be controlled to within about 0.05 seconds or even faster.

The following non-limiting examples illustrate certain embodiments. Oxygen gas was used as a source gas for generating reactive oxygen species. Source temperatures for the processes were set at the set point from to room temperature to 80° C. by heating corresponding source canisters respectively. In the examples illustrated below, a source temperature of about 50° C. or about 60° C. was used.

Example 1

Figure 8:
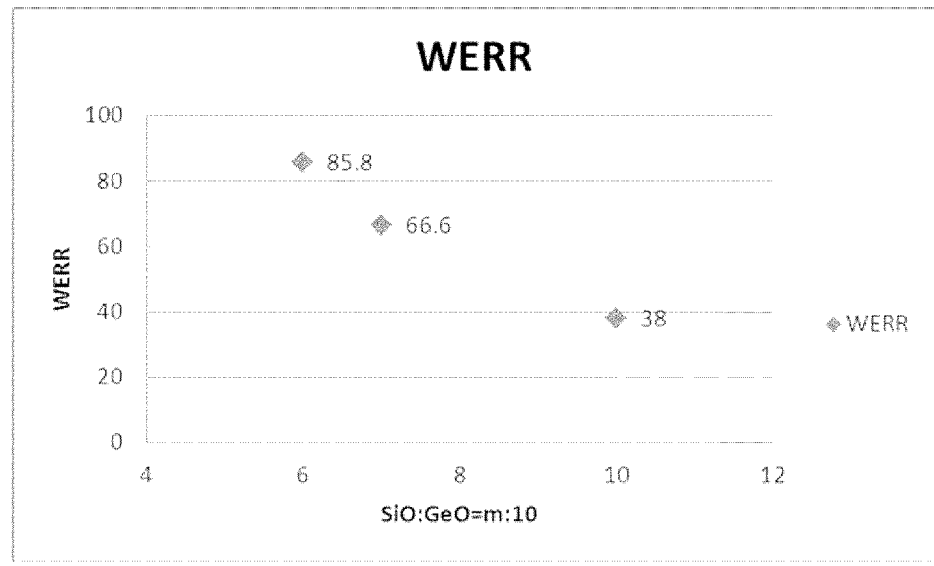
FIG. 8 illustrates the wet etch rate ratio of various SiGeO thin films in which the number of SiO cycles was adjusted relative to the number of GeO cycles.

Table 1 below and FIG. 8 demonstrate the result of experiments carried out according to the process sequence illustrated in FIG. 6A. The experiment was performed at a substrate temperature of 50° C. with an RF plasma power of 400 W. n sub-cycles of GeO with process steps time of 0.5-2.0-1.0-2.0 sec (Ge source feed-purge-$O_2$ plasma-purge), and m sub-cycles for SiO with process steps time of 0.2-0.4-0.5-2.0 sec (Si source feed-purge-O2 plasma-purge). n=10, and m varied. FIG. 8 shows the WERR result based on the number of SiO sub-cylces.

TABLE 1

|  | $GeO_2$ | $SiO_2$ |
| --- | --- | --- |
| Source temperature | 50deg. C. | 60deg. C. |
| Plasma power | 400 W | 400 W |
| Substrate temperature | 50° C. | 50° C. |
| Feed/Purge/RF/Purge | 0.5/2.0/1.0/2.0 | 0.2/0.4/0.5/2.0 |
| Number of each sub-cycle | 10 | 6, 7, 10 |

The wet etch test was evaluated at room temperature using 1:100 DHF solution. Wet etch rate ratio (WERR) was calculated by the following equation:

WERR=sample wet etch rate [nm/min]/thermal $SiO_2$ wet etch rate [nm/min]

As can be seen in FIG. 8, the WERR per unit cycle was observed to decrease as the number of SiO sub-cycles increased. In other words, it was found that different concentrations of $SiO_2$ achieved different WERRs.

Example 2

Table 2 below and FIG. 9 demonstrate the experimental results achieved by varying the time that a plasma was generated, i.e., RF-on time. Again, the process sequence illustrated in FIG. 6A was used. As can be seen from the experimental conditions, the unit process in this condition was comprised of only one sub-cycle of GeO and only one sub-cycle of SiO.

TABLE 2

|  | $GeO_2$ | $SiO_2$ |
| --- | --- | --- |
| Source temperature | 50deg. C. | 60deg. C. |
| Plasma power | 400 W | 400 W |
| Substrate temperature | 50deg. C. | 50deg. C. |
| Feed/Purge/RF/Purge | 0.5/2.0/1.0/2.0 | 0.2/0.4/0.5/2.0 |

Figure 9:
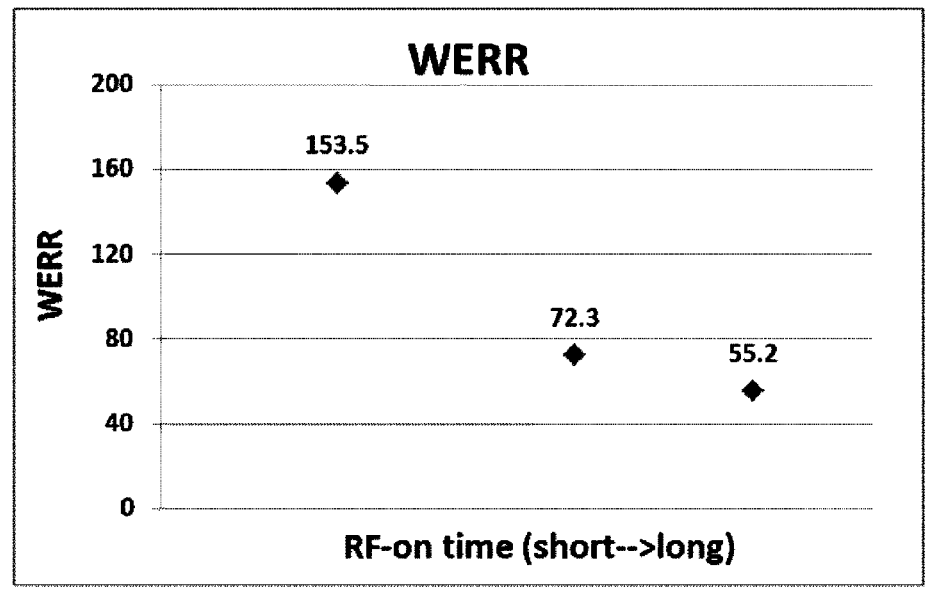
FIG. 9 illustrates the wet etch rate ratio of various SiGeO thin films in which the RF time for plasma generation was varied.

As can be seen from FIG. 9, the WERR decreased gradually as RF-on time increased. These results demonstrate that a desired WER can be obtained by controlling RF-on time in a process sequence performed according to the present disclosure.

Example 3

Table 3 below and FIG. 10 demonstrate the result of a SiGeO laminated process performed at 200° C. and 300° C. According to FIG. 10, the deposition sub-cycle of $SiO_2$ was fixed to 1 cycle and the sub-cycle for $GeO_2$ varied. Again, the experiment was done with the process sequence illustrated in FIG. 6A.

TABLE 3

|  | $GeO_2$ | $SiO_2$ |
| --- | --- | --- |
| Source temperature | 50° C. | 50° C. |
| Plasma power | 200 W | 100 W |
| Suscepter temperature | 200° C., 300° C. | 200° C., 300° C. |
| Feed/Purge/RF/Purge | 0.5/1.0/0.3/0.1 | 0.2/0.3/0.2/0.1 |
| Number of sub-cycles | 2, 4, and 5 | 1 |

Figure 10:
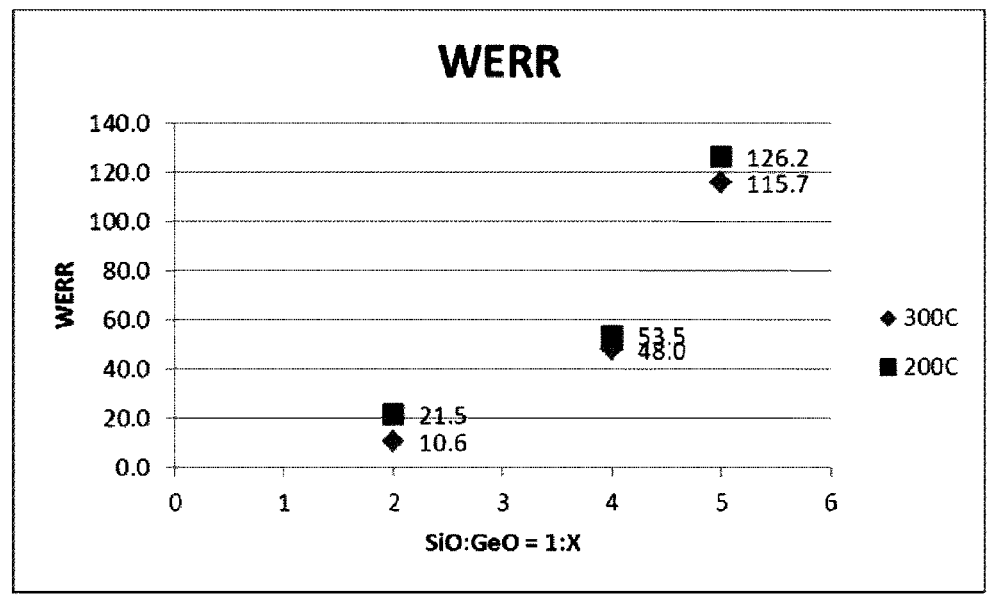
FIG. 10 illustrates the wet etch rate ratio of various SiGeO thin films in which the number of GeO cycles was adjusted relative to the number of SiO cycles, and two different temperatures were used to form the films.

As can be seen from FIG. 10, the experimental data shows controllable high wet etch rate by increasing the number of GeO deposition sub-cycles in the SiGeO film. Compared with Example 1 and Example 2, the controllable extreme high WERR is achieved not only at low substrate temperatures (e.g., 50° C.) but also high substrate temperatures (e.g., 200° C. and 300° C.).

Example 4

Figure 11:
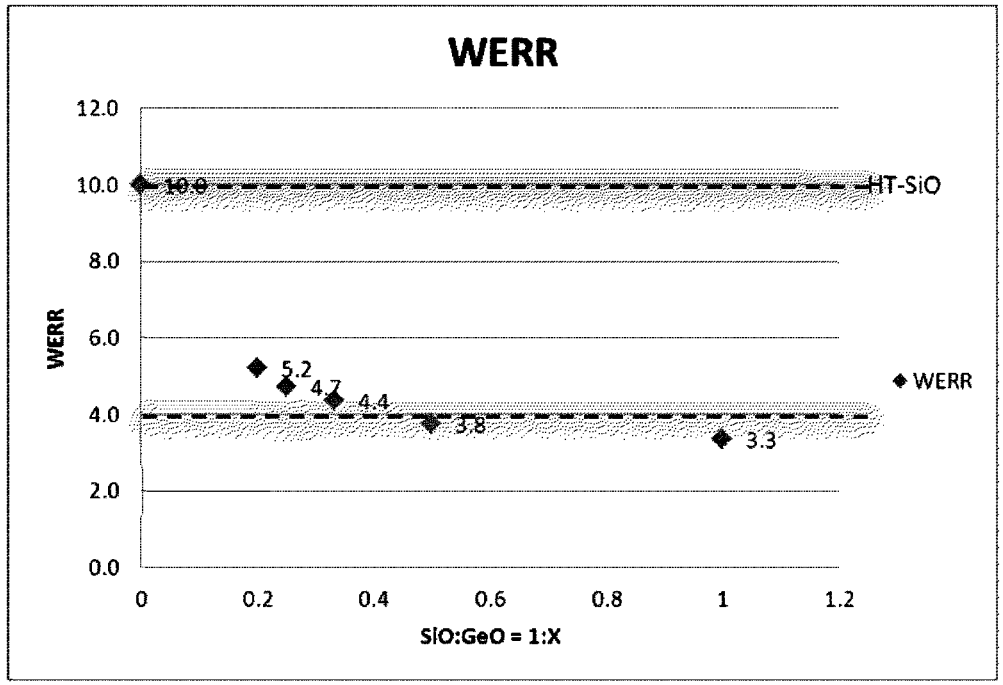
FIG. 11 illustrates minimum wet etch rate ratios achieved by varying the GeO cycles relative to the SiO cycles as compared to the normal range of minimum wet etch rate ratios achieved using only SiO.

FIG. 11 shows the controllability of a process for forming SiGeO. By adjusting the ratio of deposition sub-cycles for SiO and GeO, respectively, a relatively low WERR could be achieved. Conventional methods for forming SiO films (e.g., PECVD and PEALD) at high substrate temperatures result in a WERR of about 4 to 10, which was thought of as the theoretical limitation of PECVD, PEALD SiO films. This limit is shown in FIG. 11.

Table 4 contains the process conditions used to produce a number of SiGeO films according to the present disclosure. The films demonstrate that a lower ratio of GeO sub-cycles to SiO sub-cycles results in a WERR of about 3 to 4. It can be supposed that the SiGeO film had a stronger bonding peak on Si—O, Ge—O, and Si—O—Ge than Si—O—Si.

TABLE 4

|  | $GeO_2$ | $SiO_2$ |
| --- | --- | --- |
| Source temperature | 50° C. | 50° C. |
| Plasma power | 200 W | 100 W |
| Substrate temperature | 300° C. | 300° C. |
| Feed/Purge/RF/Purge | 0.5/1.0/0.3/0.1 | 0.2/0.3/0.2/0.1 |
| Number of sub-cycles | 1 | 1, 2, 3, 4, and 5 |

Example 5

Figure 12:
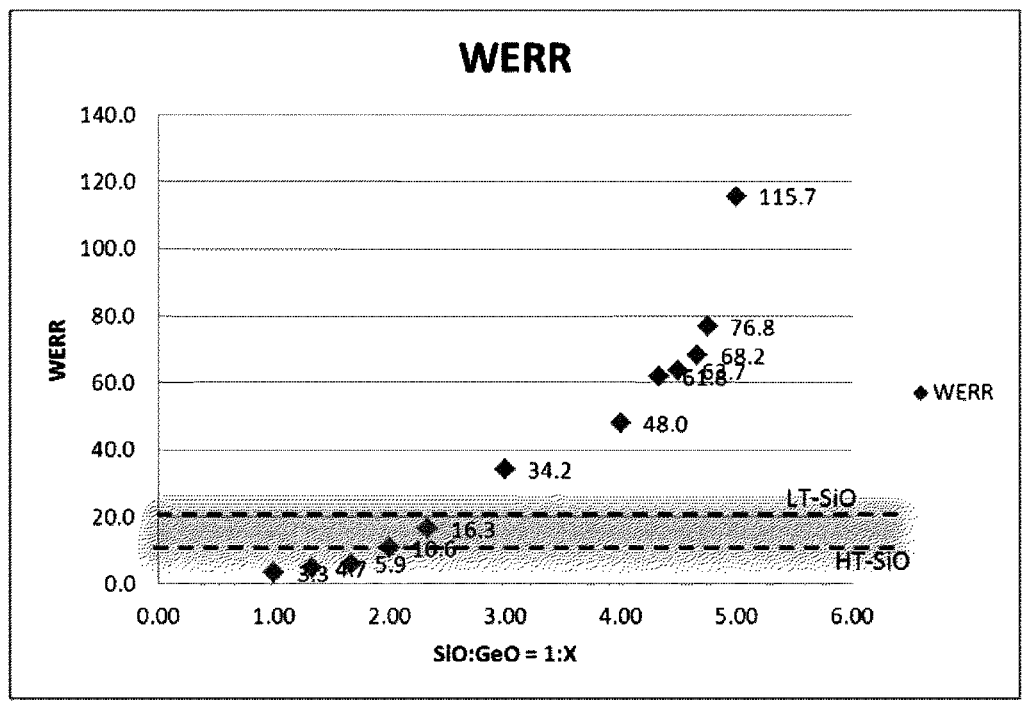
FIG. 12 illustrates maximum wet etch rate ratios achieved by varying the GeO cycles relative to the SiO cycles as compared to the normal range of maximum wet etch rate ratios achieved using only SiO.

FIG. 12 demonstrates the WERR results of various SiGeO films produced according to the present disclosure with the reaction conditions shown in Table 5 below. FIG. 12 shows that the WERR of some SiGeO thin films can be stably adjusted from about 3 to about 120. According to some embodiments, the highest WERR achieved was about 400. In contrast, SiO$_2$ films produced with conventional methods exhibited a maximum WERR of about 20 in low substrate temperatures. Thus, it can be seen that the wide latitude of WERRs achievable through the presently disclosed methods could be very desirable in any number of semiconductor fabrication applications.

TABLE 5

|  | GeO$_2$ | SiO$_2$ |
| --- | --- | --- |
| Source temperature | 50° C. | 50° C. |
| Plasma power | 200 W | 100 W |
| Substrate temperature | 300° C. | 300° C. |
| Feed/Purge/RF/Purge | 0.5/1.0/0.3/0.1 | 0.2/0.3/0.2/0.1 |
| Number of sub-cycles | Variable value between 1 and 5 | 1 |

Example 6

Figure 13:
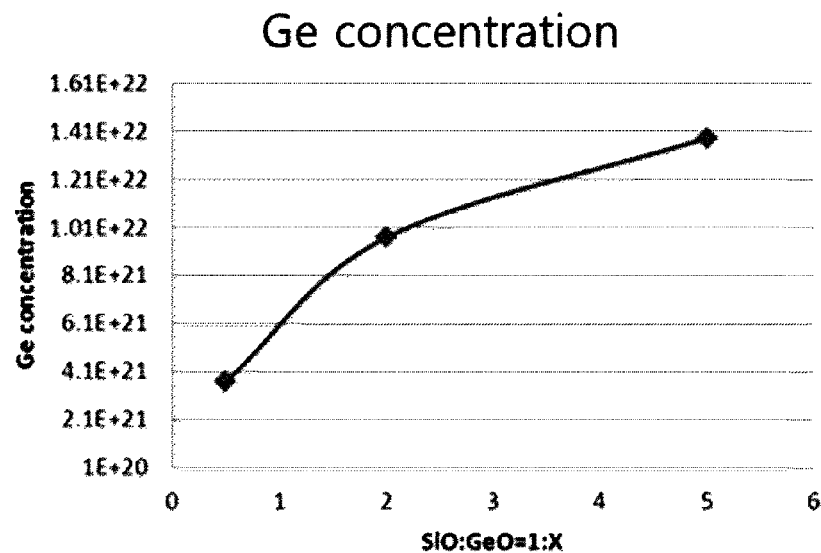
FIG. 13 illustrates the concentration of Ge achieved in various SiGeO films where the number of GeO was adjusted relative to the number of SiO cycles.

FIG. 13 shows the Ge concentration in different SiGeO films in which the ratio of SiO and GeO sub-cycles were varied, and the process conditions listed in Table 6 below were used.

TABLE 6

|  | GeO$_2$ | SiO$_2$ |
| --- | --- | --- |
| Source temperature | 50° C. | 50° C. |
| Plasma power | 200 W | 100 W |
| Suscepter temperature | 300° C. | 300° C. |
| Feed/Purge/RF/Purge | 0.5/1.0/0.3/0.1 | 0.2/0.3/0.2/0.1 |
| Number of sub-cycles | 2 and 1 | 1, 5 and 2 |

Figure 14:
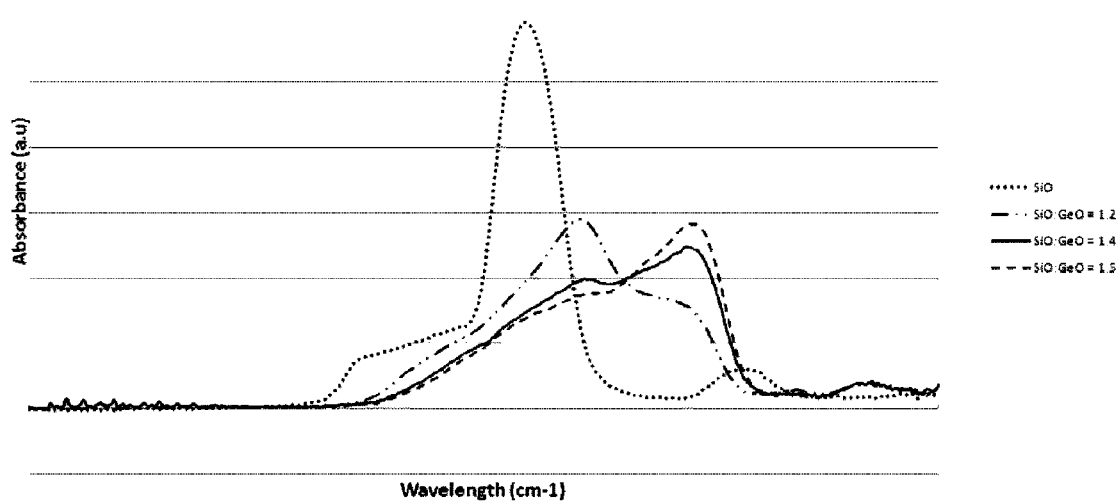
FIG. 14 illustrates an FT-IR analysis of various SiGeO films formed by adjusting the ratio of GeO cycles relative to SiO cycles.

FIG. 14 shows an FT-IR analysis of various SiGeO thin films formed using the methods disclosed herein. The SiGeO films were obtained using the following ratios of SiO$_2$ and GeO$_2$ sub-cycles: 1:2, 1:4, and 1:5. It can be seen by comparing the wavelength of SiO$_2$, that the wavelength shifts to right as that number of GeO sub-cycles is increased.

Figure 15A:
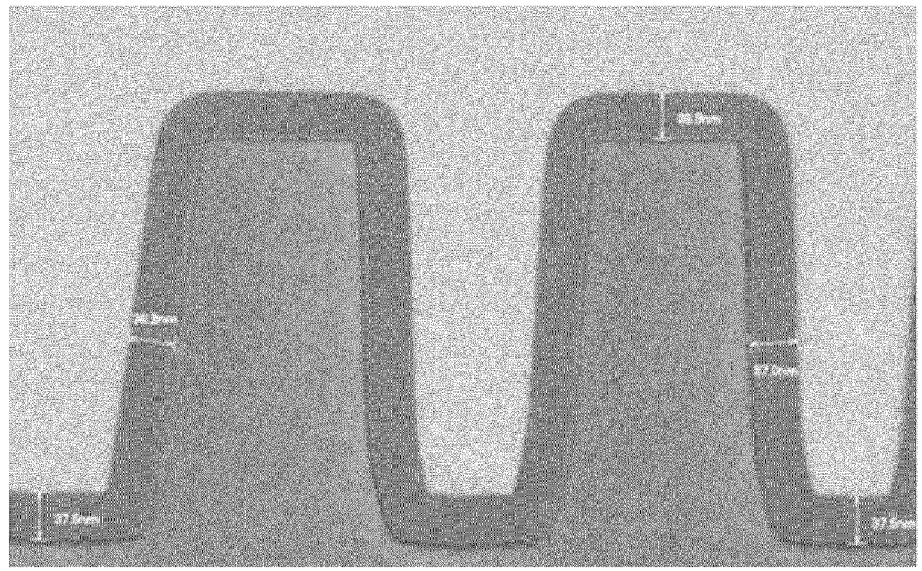
FIGS. 15A-B illustrate the step coverage results achieved using the methods disclosed herein on aspect ratios of 2.5 and 10:1, respectively.
Figure 15B:
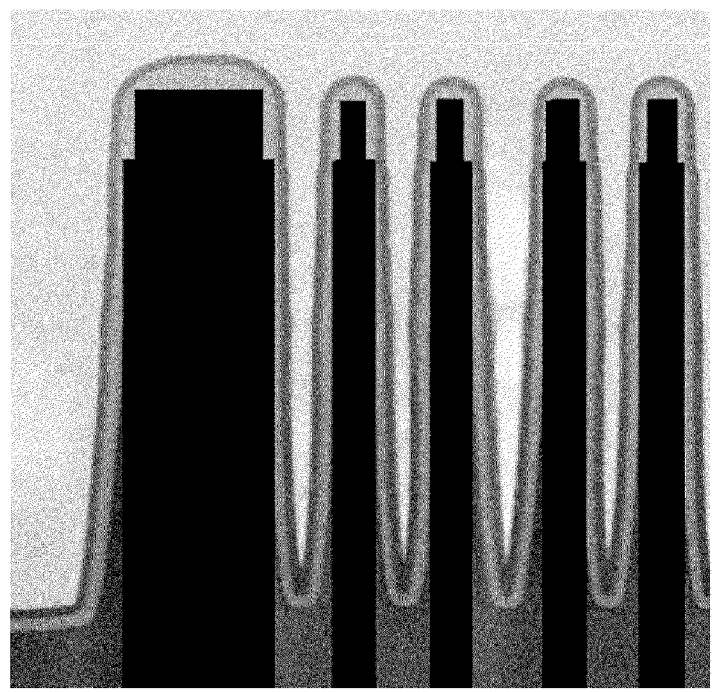

This kind of bonding structure had not been observed before in conventional SiO$_2$ films, and it is possible that the shifting of wavelengths can be attributed to the weakening bonding energy of Si—O as Ge atoms are inserted into the SiO$_2$ lattice structure resulting in higher WERRs FIGS. 15A-B illustrate the step coverage achieved in structures of different aspect ratios. The films shown in these figures were deposited using the sequence illustrated in FIG. 6A where the GeO sub-cycle was performed five times for every SiO sub-cycle. FIG. 15A is an image of a structure having an AR=2.5, and FIG. 15B is an image of a structure having an AR=12. 100% step coverage was observed in structures having an AR=2.5 as well as structures having an AR>12. Such results demonstrate that this process can be applied to high AR processes such as air gap or next generation DRAM.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

We claim:

1. A method for forming a silicon germanium oxide thin film on a substrate in a reaction space by at least one complete cycle of an atomic layer deposition (ALD) process, wherein one complete cycle comprises:
a germanium oxide deposition sub-cycle comprising:
contacting the substrate with a germanium reactant,
removing excess germanium reactant, and
contacting the substrate with a first oxygen reactant; and
a silicon oxide deposition sub-cycle comprising:
contacting the substrate with a silicon reactant,
removing excess silicon reactant, and
contacting the substrate with a second oxygen reactant.

2. The method of claim 1, wherein at least one of the first and second oxygen reactants comprises oxygen plasma.

3. The method of claim 2, wherein the oxygen plasma is generated from a flowing oxygen source.

4. The method of claim 3, wherein the oxygen source is flowed throughout the atomic layer deposition process.

5. The method of claim 3, wherein the oxygen source is provided intermittently in the germanium oxide sub-cycle and the silicon oxide sub-cycle.

6. The method of claim 2, wherein the oxygen source comprises oxygen gas.

7. The method of claim 1, wherein for at least one complete cycle, the ratio of germanium oxide deposition sub-cycles to silicon oxide deposition sub-cycles is greater than or equal to about 1:1.

8. The method of claim 1, wherein for at least one complete cycle, the ratio of germanium oxide deposition sub-cycles to silicon oxide deposition sub-cycles is less than or equal to about 1:1.

9. The method of claim 1, wherein the ratio of the germanium oxide deposition sub-cycles to the silicon oxide deposition sub-cycles is selected such that the silicon germanium oxide thin film has a wet etch rate ratio of between 3 and 400 relative to thermal oxide.

10. The method of claim 1, wherein for at least one complete cycle, the silicon oxide deposition sub-cycle precedes the germanium deposition sub-cycle.

11. The method of claim 1, wherein the silicon germanium oxide film has a step coverage of at least about 95% on a three-dimensional structure with an aspect ratio of at least about 20:1.

12. The method of claim 1, wherein the silicon germanium oxide film has a wet etch rate ratio relative to thermal oxide of less than about 4.

13. The method of claim 1, wherein the silicon germanium oxide film achieves a wet etch rate ratio relative to thermal oxide of greater than about 20.

14. The method of claim 1, wherein the deposition temperature is between about 450° C. and about 50° C.

15. The method of claim 1, wherein the silicon reactant is selected from the the group consisting of (SiH$_3$)$_3$N, (SiH$_3$)$_2$, (SiH$_3$)$_2$NMe, (SiH$_3$)$_2$Net, (SiH$_3$)$_2$N(iPr), (SiH$_3$)$_2$N(tBu), SiH$_3$NEt$_2$, SiH$_3$N(iPr)$_2$, SiH$_3$N(tBu)$_2$, SiH$_2$(NEt$_2$)$_2$, SiH$_2$(NMe$_2$)$_2$, SiH$_2$(NHtBu)$_2$, SiH$_2$(NHSiMe$_3$)$_2$, Si(OEt)$_4$, SiCl$_4$, Si$_2$Cl$_6$, SiH$_2$Cl$_2$, SiH(N(Me)$_2$)$_3$, SiH$_2$[N(Et)(Me)]$_2$, Si$_2$(NHEt)$_6$, Si(NHEt)$_4$, and Si$_3$H$_8$.

16. The method of claim 1, wherein the germanium reactant is selected from the group consisting of Ge(NMe$_2$)$_4$, Ge(NEtMe)$_4$; Ge(NEt$_2$)$_4$, iPr$_3$GeCl, iPr$_3$GeNMe$_2$, iPr$_3$GeNEtMe, and iPr$_3$GeNEt$_2$.

17. The method of claim 1, wherein at least one of the first and second oxygen reactants is selected from the following list: O$_2$, O$_3$, NO, NO$_2$, CO$_2$, a plasma generated from one or more of these, or a combination thereof.

18. The method of claim 1, wherein removing comprises flowing a purge gas through the reaction space.

19. The method of claim 1, wherein the germanium reactant is Ge[N(CH$_3$)$_2$]$_4$, the silicon reactant is SiH$_2$[N(C$_2$H$_5$)$_2$]$_2$, and at least one of the first and second oxygen reactants comprises oxygen plasma.

20. A method for forming a silicon germanium oxide thin film on a substrate in a reaction space by performing a plurality of an atomic layer deposition (ALD) cycles, wherein at least one ALD cycle comprises:

at least one ALD germanium oxide deposition sub-cycle; and at least one ALD silicon oxide deposition sub-cycle.

21. The method of claim 20, wherein the at least ALD one germanium oxide deposition sub-cycle comprises:

contacting the substrate with a germanium reactant, removing excess germanium reactant, and contacting the substrate with a first oxygen reactant.

22. The method of claim 20, wherein the at least one ALD silicon oxide deposition sub-cycle comprises:

contacting the substrate with a silicon reactant, removing excess silicon reactant, and contacting the substrate with a second oxygen reactant.

23. The method of claim 20, wherein a ratio of the at least one germanium deposition sub-cycles to the at least one silicon deposition sub-cycles is greater than or equal to about 1:1.

24. The method of claim 20, wherein a ratio of the at least one germanium deposition sub-cycles to the at least one silicon deposition sub-cycles is less than or equal to about 1:1.

25. The method of claim 20, wherein a ratio of the at least one germanium oxide deposition sub-cycle to the at least one silicon oxide deposition sub-cycle is between about 1:20 and about 20:1.

26. The method of claim 20, wherein an oxygen plasma is used in at least one of the at least one ALD germanium oxide deposition sub-cycle and the at least one ALD silicon oxide deposition sub-cycle.

\* \* \* \* \*